(12) United States Patent
Huang et al.

(10) Patent No.: US 12,199,095 B2
(45) Date of Patent: Jan. 14, 2025

(54) FIN FIELD EFFECT TRANSISTORS HAVING VERTICALLY STACKED NANO-SHEET

(71) Applicant: Taiwan Semiconductor Manufacturing Co., Ltd., Hsinchu (TW)

(72) Inventors: Wang-Chun Huang, Hsinchu (TW); Chih-Hao Wang, Baoshan Township (TW); Ching-Wei Tsai, Hsinchu (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 431 days.

(21) Appl. No.: 17/504,211

(22) Filed: Oct. 18, 2021

(65) Prior Publication Data
US 2022/0037318 A1 Feb. 3, 2022

Related U.S. Application Data

(62) Division of application No. 16/589,888, filed on Oct. 1, 2019, now Pat. No. 11,152,358.

(51) Int. Cl.
*H01L 27/088* (2006.01)
*H01L 21/02* (2006.01)
(Continued)

(52) U.S. Cl.
CPC .... *H01L 27/0886* (2013.01); *H01L 21/02603* (2013.01); *H01L 21/30604* (2013.01); *H01L 21/308* (2013.01); *H01L 21/823412* (2013.01); *H01L 21/823431* (2013.01); *H01L 21/823456* (2013.01); *H01L 29/0673* (2013.01); *H01L 29/0847* (2013.01); *H01L 29/42376* (2013.01);
(Continued)

(58) Field of Classification Search
CPC .......... H01L 27/0886; H01L 29/42392; H01L 29/78696; H01L 29/0673; H01L 29/66742; H01L 29/0847; H01L 21/02603; H01L 21/30604; H01L 21/823412; H01L 21/823431; H01L 21/823456; H01L 29/42376; H01L 29/66795; H01L 29/7851; H01L 29/78618
See application file for complete search history.

(56) References Cited

U.S. PATENT DOCUMENTS

| 10,263,100 B1 | 4/2019 | Bi et al. |
| 2017/0352761 A1 | 12/2017 | Cantoro et al. |

(Continued)

*Primary Examiner* — Changhyun Yi
(74) *Attorney, Agent, or Firm* — Sterne, Kessler, Goldstein & Fox P.L.L.C.

(57) ABSTRACT

The present disclosure describes a structure including a fin field effect transistor (finFET) and a nano-sheet transistor on a substrate and a method of forming the structure. The method can include forming first and second vertical structures over a substrate, where each of the first and the second vertical structures can include a buffer region and a first channel layer formed over the buffer region. The method can further include disposing a masking layer over the first channel layer of the first and second vertical structures, removing a portion of the first vertical structure to form a first recess, forming a second channel layer in the first recess, forming a second recess in the second channel layer, and disposing an insulating layer in the second recess.

20 Claims, 13 Drawing Sheets

(51) Int. Cl.
  *H01L 21/306* (2006.01)
  *H01L 21/308* (2006.01)
  *H01L 21/8234* (2006.01)
  *H01L 29/06* (2006.01)
  *H01L 29/08* (2006.01)
  *H01L 29/423* (2006.01)
  *H01L 29/66* (2006.01)
  *H01L 29/78* (2006.01)
  *H01L 29/786* (2006.01)

(52) U.S. Cl.
  CPC .. *H01L 29/42392* (2013.01); *H01L 29/66742* (2013.01); *H01L 29/66795* (2013.01); *H01L 29/7851* (2013.01); *H01L 29/78618* (2013.01); *H01L 29/78696* (2013.01)

(56) References Cited

U.S. PATENT DOCUMENTS

| | | |
|---|---|---|
| 2019/0122937 A1 | 4/2019 | Cheng et al. |
| 2020/0381427 A1* | 12/2020 | Suh .................... H01L 29/7851 |
| 2020/0411515 A1* | 12/2020 | Kim .................... H01L 27/0886 |
| 2021/0020446 A1 | 1/2021 | Sieg et al. |
| 2021/0098450 A1 | 4/2021 | Huang et al. |

* cited by examiner

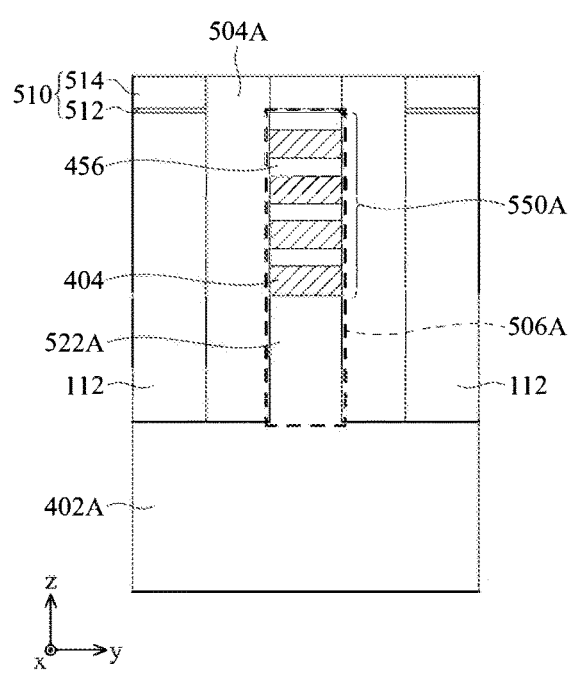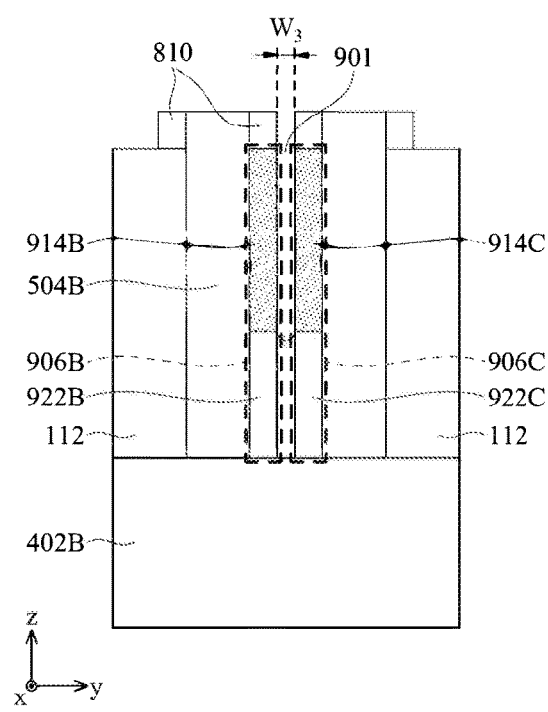
FIG. 9A
FIG. 9B

FIN FIELD EFFECT TRANSISTORS HAVING VERTICALLY STACKED NANO-SHEET

CROSS-REFERENCE TO RELATED APPLICATION

This application is a divisional of U.S. patent application Ser. No. 16/589,888, titled "Vertical Structure for Semiconductor Device," which was filed on Oct. 1, 2019, and is incorporated herein by reference in its entirety.

BACKGROUND

A advances in semiconductor technology has increased the demand for semiconductor devices with higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and nano-sheet FETs. Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 4A-12A are cross-sectional views of a semiconductor device at various stages of its fabrication process, according to some embodiments.

FIGS. 4A, 5A, 6A, 7A, 8A, 9A, 10A, 11A, and 12A are cross-sectional views of a semiconductor device at various stages of its fabrication process, according to some embodiments.

FIGS. 4B, 5B, 6B, 7B, 8B, 9B, 10B, 11B, and 12B are cross-sectional views of a semiconductor device at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
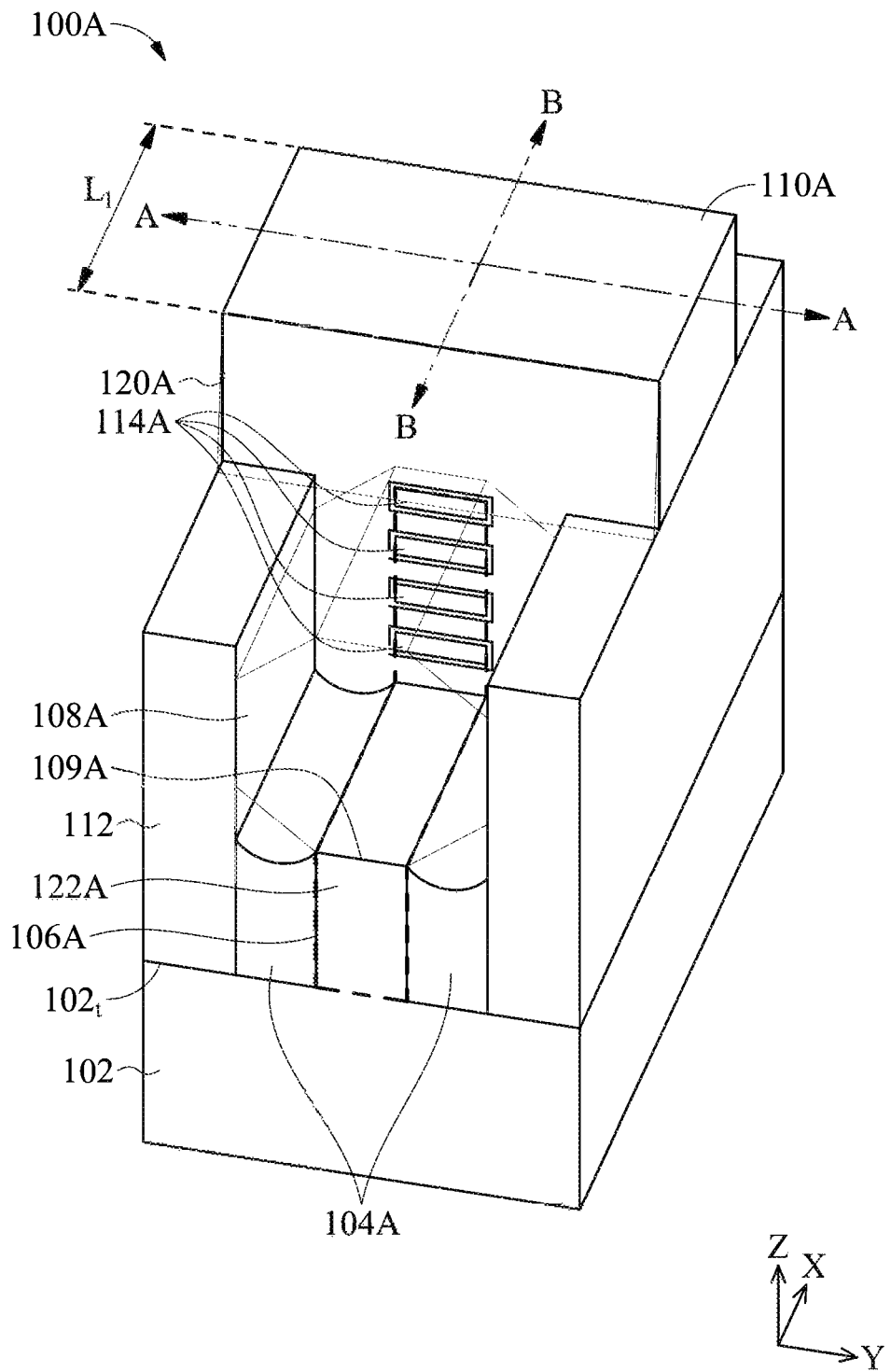
FIGS. 1A and 1B are isometric views of various semiconductor devices, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "nominal" refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "substantially" and "about" indicates the value of a given quantity that can vary based on a particular technology node associated with the subject semiconductor device. In some embodiments, the terms "substantially" and "about" can indicate a value of a given quantity that varies within, for example, ±5% of a target (or intended) value (e.g., ±1%, ±2%, ±3%, ±4%, or ±5% of the target (or intended) value).

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials, such as silicon, germanium, gallium arsenide, indium phosphide, etc. Alternatively, the substrate may be made from an electrically non-conductive material, such as a glass or a sapphire wafer.

As used herein, the term "vertical" means nominally perpendicular to a substrate's surface.

As used herein, the term "selectivity" refers to the ratio of the etch rates of two materials under the same etching conditions.

As used herein, the term "high-k" refers to a high dielectric constant. In some embodiments, high-k refers to a dielectric constant that is greater than the dielectric constant of $SiO_2$ (e.g., greater than 3.9).

As used herein, the term "low-k" refers to a small dielectric constant. In some embodiments, low-k refers to a dielectric constant that is less than the dielectric constant of $SiO_2$ (e.g., less than 3.9).

Technology advances in semiconductor industry drive the pursuit of integrated circuits (ICs) having higher device density, higher performance, and lower cost. In the course of the IC evolution, the pitch size and the gate length of field effect transistors (ITT) keep scaling down. Nevertheless, the scaling down of the gate length inevitably exacerbates the FET's device performance (e.g., short channel effect). On the other hand, the nano-sheet FET has a gate-all-around (GAA) structure that effectively modulates the ITT's channel to reconcile short channel effects to maintain the FET's device performance. In some instances, the nano-sheet FET is also referred to herein as a "nano-wire FET" or a "nano-ring FET."

Despite the advantage of reconciling short channel effects, nano-sheet FET can be subjected to shape deformation once the nano-sheet FET's gate length is beyond a certain length (e.g., beyond 100 nm). The nano-sheet FET's shape deformation can cause nano-sheet channel bending that can impact performance and yield of the nano-sheet FET. For example, such nano-sheet shape bending can cause an electrical short (e.g. nano-sheet channels physically in contact with each other or in contact with the substrate) or electrical open (e.g., nano-sheet channel breaks) of the nano-sheet FET.

Embodiments of the present disclosure are directed to a fabrication method and structure that provide integrating nano-sheet FETs and fin field effect transistors (finFETs) on a substrate. The fabrication method can include providing a substrate having a nano-sheet stack and replacing a portion of substrate's nano-sheet stack with a finFET stack. In some embodiments, the replacement of the nano-sheet stack can include forming a recess at a selected portion of the substrate by etching the nano-sheet and epitaxially growing the finFET stack within the recess. By way of example and not limitation, the nano-sheet stack can include multiple layers of silicon and silicon-germanium, and the finFET stack can include an epitaxially grown silicon layer. As a result, a hybrid device with nano-sheet FETs and finFETs can be included on the same substrate. The hybrid device's finFETs can be configured with a relative longer gate length that could otherwise cause nano-sheet FET shape deformation. As such, such hybrid device can allow the nano-sheet FETs to have a relative shorter channel and therefore can avoid nano-sheet FET shape deformation. A benefit of the present disclosure is to provide a scheme to concurrently form nano-sheet FETs and finFETs on the same substrate, thus allowing ICs to incorporate multiple functionality (e.g., short channel nano-sheet FETs for logic IC and long-channel finFETs for peripheral IC) while satisfying the requirements of high performance, low cost, and high reliability.

Figure 1B:
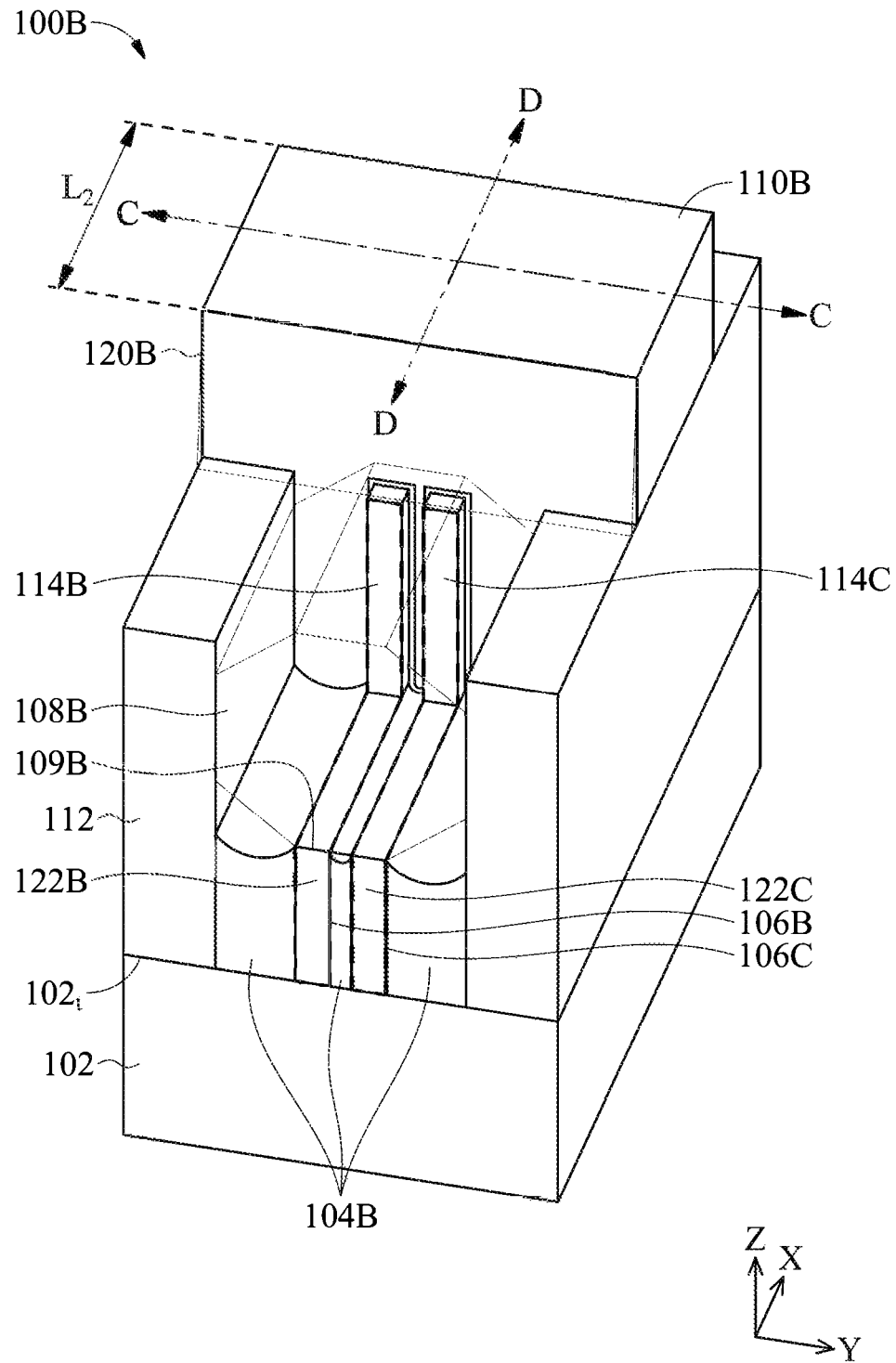

FIGS. 1A and 1B are isometric views of a nano-sheet FET 100A and a finFET 100B, respectively, according to some embodiments. The discussion below of elements in FIG. 2A applies to elements with the same annotations in FIG. 2B unless mentioned otherwise. The views of nano-sheet FET 100A and finFET 100B in respective FIGS. 1A and 1B are shown for illustration purposes and may not be drawn to scale.

Nano-sheet FET 100A and finFET 100B can be formed on substrate 102. In some embodiments, nano-sheet FET 100A and finFET 100B can be part of a same integrated circuit (IC) (not shown) on substrate 102. In some embodiments, nano-sheet FET 100A and finFET 100B can be separated by a distance (not shown in FIGS. 1A and 1B), where the distance can range from 50 nm (e.g., nano-sheet FET 100A and finFET 100B are neighboring devices) to 200 mm (e.g., nano-sheet FET 100A and finFET 100B are located at different areas of a semiconductor wafer). Nano-sheet FET 100A and finFET 100B can include shallow trench isolation (STI) regions 104A and 104B, vertical structures 106A and 106B, source/drain (S/D) regions 108A and 108B, and gate structures 110A and 110B. Each of nano-sheet FET 100A and finFET 100B can be either n-type FETs or p-type FETs. In some embodiments, nano-sheet FET 100A and finFET 100B can include more than one vertical structures that can have similar or identical material and/or geometry as vertical structures 106A and 106B. For example, as illustrated in FIG. 1B, finFET 100B can further include a vertical structure 106C that can have identical material and/or geometry as vertical structure 106B. In some embodiments, the IC on substrate 102 can include one or more nano-sheet FETs and finFETs respectively similar to nano-sheet FET 100A and finFETs 100B.

Substrate 102 can be a physical material on which nano-sheet FET 100A and finFET 100B are formed. Substrate 102 can be a bulk semiconductor wafer or the top semiconductor layer of a semiconductor-on-insulator (SOI) wafer (not shown), such as silicon-on-insulator. In some embodiments, substrate 102 can include a crystalline semiconductor layer with its top surface $102r$ parallel to (100), (110), (111), or c-(0001) crystal plane. In some embodiments, substrate 102 can be a glass or plastic substrate. Substrate 102 can be made of a semiconductor material such as, but is not limited to, silicon (Si). In some embodiments, substrate 102 can include (i) an elementary semiconductor, such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus or arsenic). In some embodiments, a portion and another portion of substrate 102 can have opposite type dopants with each other. For example, a portion of substrate 102 underlying nano-sheet FET 100A and an other portion of substrate 102 underlying finFET 100B can have opposite type dopants with each other.

STI regions 104A and 104B can provide electrical isolation to nano-sheet FET 100A and finFET 100B from each other and from neighboring active and passive elements (not illustrated herein) integrated with or deposited onto substrate 102. STI regions 104A and 104B can each be made of a dielectric material. In some embodiments, STI regions 104A and 104B can each include silicon oxide, silicon nitride, silicon oxynitride, fluorine-doped silicate glass (FSG), a low-k dielectric material, and/or other suitable insulating material. In some embodiments, STI regions 104A and 104B can each include a multi-layered structure. In some embodiments, STI regions 104A and 104B can be formed during the fabrication of nano-sheet FET 100A and finFET 100B.

Vertical structures 106A and 106B can be current-carrying structures for nano-sheet FET 100A and finFET 100B. Vertical structures 106A and 106B can traverse along an x-direction and through respective gate structures 110A and 110B. In some embodiments, vertical structures 106A and 106B can traverse along the <110>, <100>, or <111> crystal direction. Vertical structure 106A and 106B can each include one or more channel regions 114A and 114B respectively underlying gate structures 110A and 110B. Each channel region 114A in vertical structure 106A can be vertically and physically separated from each other, while each channel region 114B in vertical structure 106B can be vertically stacked and in contact with one another. For example, FIG. 1A illustrates four channel regions 114A in vertical structure 106A, where the four channel regions 114A can be vertically and physically separated from each other. Further, channel regions 114A and 114B can be disposed over substrate 102. In some embodiments, vertical structure 106A can further include a buffer region 122A between substrate 102 and channel region 114A. Similarly, in some embodiments, vertical structure 106B can further include a buffer region 122B between substrate 102 and channel region 114B. For nano-sheet FET 100A, each channel region 114A can be a nano-sheet layer. As a result, a top, sides, and a bottom of the each channel region 114A can be in contact with gate structure 110A. For finFET 100B, vertical structure 106B can be a fin structure, where a top and sides of vertical structure 106B can be in contact with gate structure 110B. It should be noted that even though FIGS. 1A and 1B exhibits four channel regions 114A and one channel region 114B, any suitable number of channel regions can be included in vertical structures 106A and 106B.

Furthermore, vertical structures 106A and 106B can each include material similar to substrate 102. For example, channel regions 114A and 114B, and buffer regions 122A and 122B can each include one or more crystalline layers, where a lattice constant mismatch between substrate 102 and the one or more crystalline layers can be, for example, within 5%. By way of example and not limitation, vertical structures 106A and 106B can each include Si, SiGe, Ge, and a III-V compound semiconductor (e.g., InGaAs or indium gallium nitride (InGaN)). Based on the disclosure herein, other semiconductor materials for vertical structures 106A and 106B are within the scope and spirit of this disclosure.

In some embodiments, as shown in FIG. 1B, finFET 100B can further include vertical structure 106C having channel region 114C and buffer region 122C that can have similar or identical material and/or geometry as channel region 114B. Similarly, nano-sheet FET 100A can further include other vertical structures having respective channel regions (not shown in FIG. 1A) with similar or identical material and/or geometry as channel region 114A.

S/D regions 108A and 108B can be current-carrying structures for respective nano-sheet FET 100A and finFET 100B. S/D regions 108A and 108B can each be epitaxially formed from a top surface of respective vertical structures 106A and 106B after an etch back process performed on portions of vertical structures 106A and 106B that are not underlying respective gate structures 110A and 110B. In some embodiments, S/D regions 108A and 108B can be formed concurrently during the fabrication of nano-sheet FET 100A and finFET 100B. S/D regions 108A and 108B can form respective interfaces 109A and 109B with vertical structures 106A and 106B. In some embodiments, interfaces 109A and 109B can be substantially coplanar with top surfaces of STI regions 104A and/or 104B. In some embodiments, interfaces 109A and 109B can be below the top surface of STI regions 104A and/or 104B.

In some embodiments, S/D region 108B of vertical structure 106B can be merged with another S/D region 108B of adjacent vertical structure 106C, as shown in FIG. 1B. Alternatively, S/D region 108B of finFET 100B can have unmerged epitaxial S/D regions 108B (not shown in FIG. 1B) on vertical structures 106B and 106C. Similarly, S/D region 108A can be merged or unmerged with another S/D region 108A of adjacent vertical structure. S/D regions 108A and 108B can each include an epitaxially-grown semiconductor material. The epitaxially-grown semiconductor material can be the same as substrate 102 or can have a lattice mismatch below about 5% to substrate 102. In some embodiments, the epitaxially-grown semiconductor material can include: (i) a semiconductor material, such as Ge or Si; (ii) a compound semiconductor material, such as GaAs and/or InGaAs; or (iii) a semiconductor alloy, such as SiGe and/or GaAsP.

In some embodiments, S/D regions 108A and 108B can be p-type or n-type. In some embodiments, S/D regions 108A and 108B can be of opposite doping type with respect to each other. In some embodiments, each of S/D regions 108A and 108B can be doped with p-type dopants, such as B, In, or Ga. In some embodiments, each of S/D regions 108A and 108B can be doped with n-type dopants, such as phosphorous (P) or arsenic (As).

In some embodiments, each of S/D regions 108A and 108B can be a p-type epitaxial stack (e.g. doped with B) that can include two or more epitaxial layers (Si and/or a SiGe multilayer stack; not shown in FIGS. 1A-1B) grown in succession and can feature different germanium (Ge) atomic % and different p-type dopant (e.g. boron, B) concentrations. By way of example and not limitation, the first layer can have a Ge atomic % that ranges from about 0 to about 40%, and a B dopant concentration that ranges from about $5\times10^{19}$ atoms/cm$^3$ to about $1\times10^{21}$ atoms/cm$^3$. The second epitaxial layer can have a Ge atomic % that ranges from about 20% to about 80%, and a B dopant concentration that ranges from about $3\times10^{20}$ atoms/cm$^3$ to about $5\times10^{21}$ atoms/cm$^3$. Finally, the third epitaxial layer can be a capping layer that can have similar Ge atomic % and B dopant concentrations as the first layer (e.g., about 0 to about 40% for Ge, and about $5\times10^{19}$ atoms/cm$^3$ to about $1\times10^{21}$ atoms/cm$^3$ for B dopant). The thickness of these layers can vary depending on the device performance requirements. For example, the first epitaxial layer can have a thickness range from about 10 nm to about 20 nm, the second epitaxial layer can have a thickness range from about 30 nm to about 60 nm, and the third epitaxial layer (capping layer) can have a thickness range from 0 to about 10 nm. Similarly, in some embodiments, each of S/D regions 108A and 108B can be a n-type epitaxial stack (e.g., doped with phosphorous) that can have similar dopant concentration distribution and layer stack as those of the p-type epitaxial stack described above. It is noted that the aforementioned thicknesses, dopant species, and doping concentrations are not limiting and other thickness and doping concentrations are within the spirit and the scope of this disclosure.

In some embodiments, S/D regions 108A and 108B can each be p-type having multiple sub-regions (not shown) that can include SiGe and can differ from each other based on, for example, doping concentration, epitaxial growth process conditions, and/or relative concentration of Ge with respect to Si. In some embodiments, each of the sub-regions can have thicknesses similar to or different from each other and thicknesses can range from about 0.5 nm to about 5 nm. In some embodiments, the atomic % of Ge in sub-regions closest to interfaces 109A and 109B can be smaller than the atomic % of Ge in sub-regions farthest from interfaces 109A and 109B. In some embodiments, the sub-regions closest to interfaces 109A and 109B can include Ge in a range from about 15 atomic % to about 35 atomic %, while the sub-regions farthest from interfaces 109A and 109B can include Ge in a range from about 25 atomic % to about 50 atomic % with any remaining atomic % being Si in the sub-regions. Further, the sub-regions of p-type S/D regions 108A and 108B can have varying p-type dopant concentration with respect to each other, according to some embodiments. For example, the sub-regions closest to interfaces 109A and 109B can be undoped or can have a dopant concentration lower (e.g., dopant concentration less than about $8 \times 10^{20}$ atoms/cm$^3$) than the dopant concentrations (e.g., dopant concentration in a range from about $1 \times 10^{20}$ to about $3 \times 10^{22}$ atoms/cm$^3$) of the sub-regions farthest from interfaces 109A and 109B.

In some embodiments, n-type S/D regions 108A and 108B can each include Si and can be in-situ doped during an epitaxial growth process using n-type dopants, such as phosphorus or arsenic. For n-type in-situ doping, n-type doping precursors such as, but are not limited to, phosphine ($PH_3$), arsine ($AsH_3$), and/or other n-type doping precursor can be used. In some embodiments, each of n-type S/D regions 108A and 108B can have multiple n-type sub-regions. Except for the type of dopants, the n-type sub-regions can be similar to the p-type sub-regions, in thickness, relative Ge concentration with respect to Si, dopant concentration, and/or epitaxial growth process conditions.

Based on the disclosure herein, other materials, thicknesses, Ge concentrations, and dopant concentrations for multiple n-type and/or p-type sub-regions are within the scope and spirit of this disclosure.

Gate structures 110A and 110B can traverse along the y-direction across vertical structures 106A and 106B. Gate structures 110A and 110B can respectively wrap around a portion of vertical structures 106A and 106B to surround channel regions 114A and 114B. Channel regions 114A can underlie gate structure 110A and be disposed between two S/D regions 108A. Gate structures 110A can control an electrical current flowing between the two S/D regions 108A through channel region 114A for nano-sheet FET 100A. Similarly, channel regions 114B can underlie gate structure 110B and be disposed between two S/D regions 108B. Gate structures 110B can control an electrical current flowing between the two S/D regions 108B through channel region 114B for finFET 100B. To avoid shape deformation (e.g., bending) of channel region 114A (e.g., nano-sheets 114A), a gate length $L_1$ of gate structure 110A can be shorter than or equal to that ($L_2$) of gate structure 110B. In some embodiments, gate structure 110A can have gate length $L_1$ between about 5 nm and 150 nm to avoid shape deformation of nano-sheets 114A. In some embodiments, gate structure 110A can have gate length $L_1$ between about 3 nm and 100 nm to avoid shape deformation of nano-sheets 114A. In some embodiments, gate structure 110B can have gate length $L_2$ longer than or equal to about 3 nm. In some embodiments, gate structure 110B can have gate length $L_2$ longer than or equal to about 100 nm. In some embodiments, a ratio of $L_2$ to $L_1$ (e.g., $L_2:L_1$) can be greater than about 1, greater than about 2, or greater than about 5 to avoid shape deformation of nano-sheets 114A.

Gate structures 110A and 110B can each include spacers 120A and 120B to electrically insulate gate structures 110A and 110B from S/D regions 108A and 108B. Spacers 120A and 120B can form sidewalls of gate structures 110A and 110B. Spacers 120A and 120B can each include insulating material, such as silicon oxide, silicon nitride, a low-k dielectric material, or a combination thereof. In some embodiments, each of spacers 120A and 120B can have respective thicknesses in a range from about 2 nm to about 10 nm along the x-direction. Based on the disclosure herein, other materials and thicknesses for spacers 120A and 120B are within the scope and spirit of this disclosure.

In some embodiments, nano-sheet FET 100A and finFET 100B can each further include fin isolation structure 112. Fin isolation structure 112 can be positioned between each vertical structure 106A and 106B. For example, fin isolation structure 112 can electrically insulate one vertical structure 106A of nano-sheet FET 100A from another adjacent vertical structure 106A of nano-sheet FET 100A. Similarly, fin isolation structure 112 can also electrically insulate vertical structures 106B of finFET 100B from another vertical structure 106B of finFET 100B. In some embodiments, fin isolation structure 112 can electrically insulate vertical structure 106A of nano-sheet FET 100A from vertical structure 106B of finFET 100B. In some embodiments, fin isolation structure 112 can be used to reduce active regions of nano-sheet FET 100A and finFET 100B to reduce power consumption. In some embodiments, fin isolation structure 112 can be used to separate metal-gate connections between adjacent vertical structure 106A and/or between adjacent vertical structure 106B to reduce pitch size of nano-sheet FET 100A and/or finFET 100B. Fin isolation structure 112 can have horizontal (e.g., width in the y-direction) and vertical dimensions (e.g., height in the z-direction) substantially equal to that of vertical structures 106A and 106B. In some embodiments, fin isolation structure 112 can have a vertical dimension substantially equal to or smaller than vertical dimensions of vertical structures 106A and 106B. In some embodiments, fin isolation structure 112 can include an insulating material, such as silicon oxide or silicon germanium oxide. In some embodiments, fin isolation structure 112 can include doped oxide material, such as doped $SiO_2$ with Ge dopants.

Figure 2A:
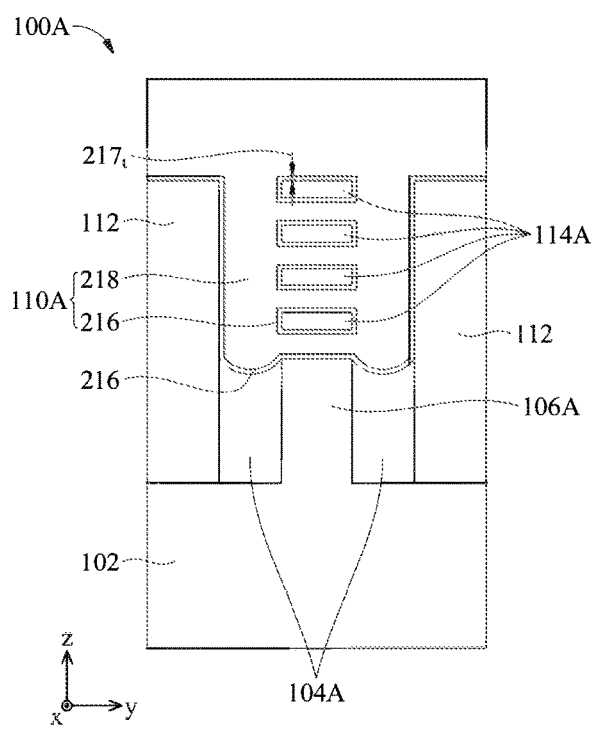
FIGS. 2A and 2B are cross-sectional views of various semiconductor devices, according to some embodiments.
Figure 2B:
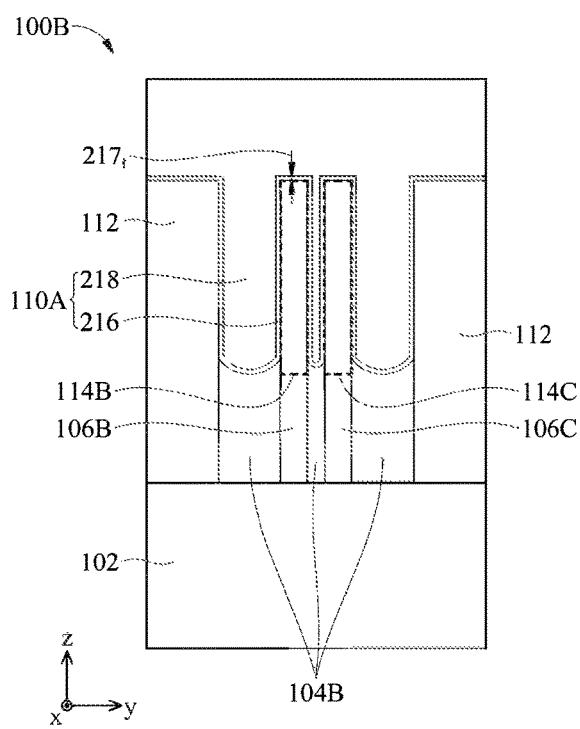

FIGS. 2A and 2B are cross-sectional views of nano-sheet FET 100A and finFET 100B along line A-A and C-C in FIGS. 1A and 1B, respectively. Referring to FIGS. 2A and 2B, gate structures 110A and 110B can include a dielectric layer 216 and a gate electrode 218. Dielectric layer 216 can be adjacent to and in contact with gate electrode 218. For example, gate electrode 218 can be formed over dielectric layer 216, and dielectric layer 216 can be formed over channel regions 114A-114C. In some embodiments, a thickness 217t of dielectric layer 216 can range from about 0.1 nm to about 10 nm. In some embodiments, gate structure 110A and 110B can further include interfacial layers (not shown in FIGS. 2A and 2B) at an interface between gate structures 110A/110B and vertical structures 106A/106B. For example, the interfacial layers can be formed between dielectric layer 216 and channel regions 114A-114C. The interfacial layers can include a dielectric material such as a silicon dioxide layer ($SiO_2$) or silicon oxynitride (SiON) and can help to repair damage on surfaces of vertical structures 106A/106B.

Dielectric layer 216 can traverse vertical structures 106A and 106B through channel regions 114A and 114B as illustrated in FIGS. 2A and 2B. In some embodiments, dielectric layer 216 can include (i) a layer of low-k dielectric material, such as silicon oxide, silicon nitride, or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. In some embodiments, dielectric layer 216 can include a single layer or a stack of insulating material layers. In some embodiments, gate structure 110A's dielectric layer 216 and gate structure 110B's dielectric layer 216 can be made of different material and have different thicknesses. Based on the disclosure herein, other materials and formation methods for dielectric layers 216 are within the scope and spirit of this disclosure.

Gate electrode 218 can include a gate work function metal layer and a gate metal fill layer. In some embodiments, the gate work function metal layer and the gate metal fill layer of gate electrode 218 can be formed by a gate replacement process during the fabrication of nano-sheet FET 100A and finFET 100B. In some embodiments, gate structure 110A's gate electrode 218 and gate structure 110B's gate electrode 218 can include different gate work function metal layers and/or gate metal fill layers.

The gate work function metal layer can be one of the factors to control and tune threshold value for current flow between S/D regions 108A for nano-sheet FET 100A and between S/D regions 108B for finFET 100B. A work function value can be associated with the composition of the one or more metals included in gate work function metal layer. The one or more metals can be chosen to set the work function of gate work function metal layer so that a desired threshold voltage is achieved. In some embodiments, the work function of the one or more metals can range from about 4 eV to about 6 eV. In some embodiments, the gate work function metal layer can be disposed on dielectric layer 216. The gate work function metal layer can include a single metal layer or a stack of metal layers. The stack of metal layers can include metals having work functions similar to or different from each other. In some embodiments, the gate work function metal layer can include, for example, Al, copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, the gate work function metal layer has a thickness in a range from about 2 nm to about 15 nm. Based on the disclosure herein, other materials, formation methods, and thicknesses for the gate work function metal layer are within the scope and spirit of this disclosure.

The gate metal fill layer can include a single metal layer or a stack of metal layers. The stack of metal layers can include metals different from each other. In some embodiments, the gate metal fill layers can each include a suitable conductive material, such as Ti, silver (Ag), Al, TiAlN, TaC, TaCN, TaSiN, manganese (Mn), Zr, TiN, TaN, ruthenium (Ru), molybdenum (Mo), WN, Cu, W, Co, Ni, titanium carbide (TiC), titanium aluminum carbide (TiAlC), metal alloys, and/or combinations thereof. Based on the disclosure herein, other materials and formation methods for the gate metal fill layer are within the scope and spirit of this disclosure.

Figure 3:
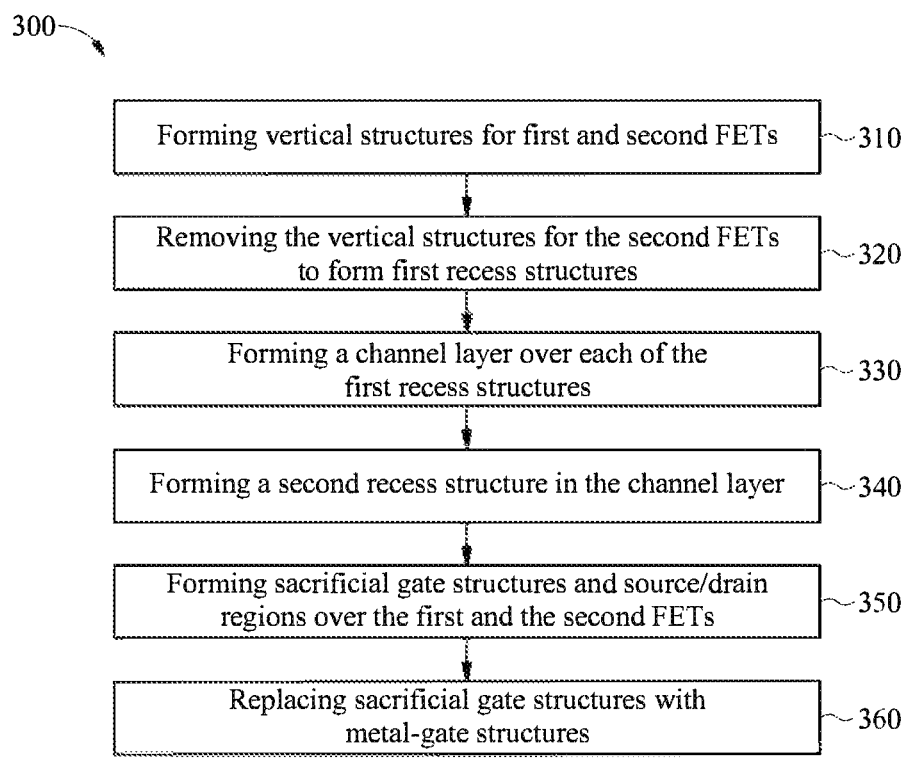
FIG. 3 is a flow diagram of a method for fabricating a semiconductor device, according to some embodiments.

FIG. 3 is a flow diagram of a method 300 for fabricating nano-sheet FET 100A and finFET 100B, according to some embodiments. For illustrative purposes, the operations illustrated in FIG. 3 will be described with reference to the example fabrication process for fabricating devices 100A and 100B as illustrated in FIGS. 4A-12A and FIGS. 4B-12B. FIGS. 4A-10A and 4B-10B are cross-sectional views along line A-A of nano-sheet FET 100A and line C-C of finFET 100B (of FIGS. 1A and 1B) at various stages of its fabrication, according to some embodiments. FIGS. 11A-12A and 11B-12B are cross-sectional views along line B-B of nano-sheet FET 100A and line D-D of finFET 100B (of FIGS. 1A and 1B) at various stages of its fabrication, according to some embodiments. Operations can be performed in a different order or not performed depending on specific applications. It should be noted that method 300 may not produce complete nano-sheet FET 100A and finFET 100B. Accordingly, it is understood that additional processes may be provided before, during, and after method 300, and that some other processes may only be briefly described herein. The discussion of elements with the same annotations in FIGS. 1A-1B, 2A-2B, 4A-12A, and 4B-12B applies to each other unless mentioned otherwise.

In some embodiments, fins of fin field effect transistors (finFETs) may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4A:
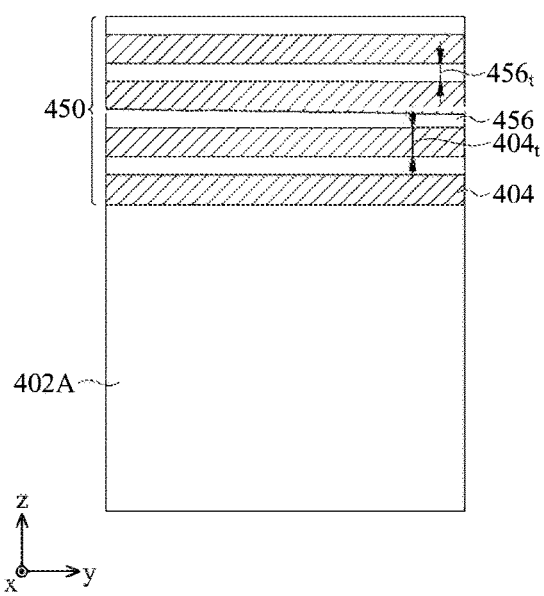
Figure 4B:
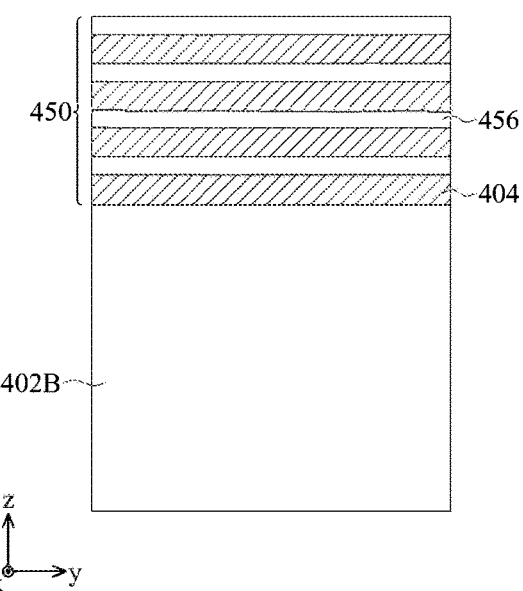
Figure 5A:
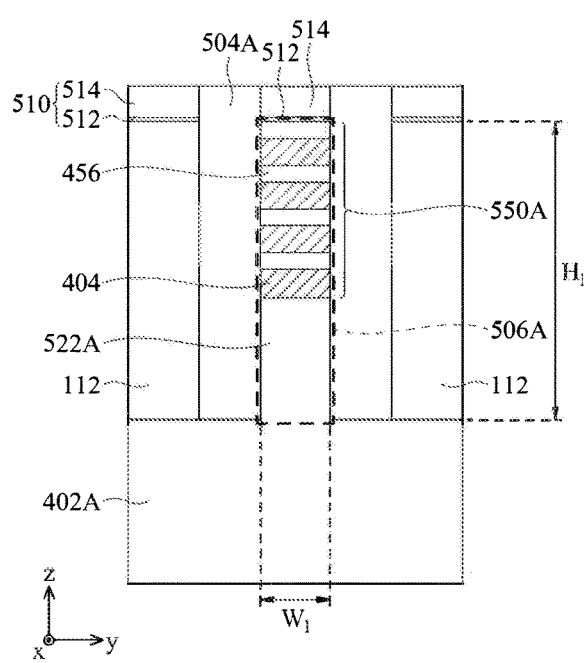
Figure 5B:
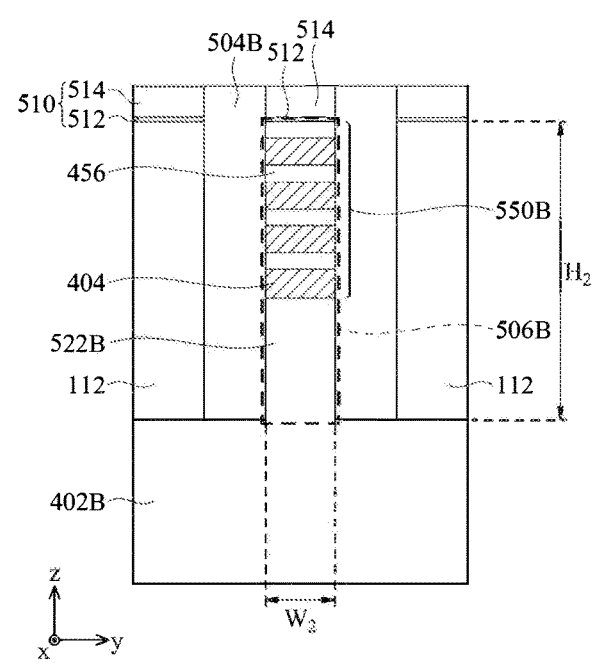

In operation 310, vertical structures for first and second FETs are formed over a substrate. For example, as shown in FIGS. 5A and 5B, vertical structure 506A for nano-sheet FET 100A can be formed on substrate 402A and vertical structure 506B for finFET 100B can be formed on substrate 402B. FIGS. 4A-5A and 4B-5B are cross-sectional views of partially fabricated structures that can be used to described the fabrication stages of operation 310. As shown in FIGS. 4A and 4B, operation 310 can begin with growing a multilayer nano-sheet stack 450 over substrates 402A and 402B. Substrates 402A and 402B can be different portions of a same substrate, such as substrate 102. In some embodiments, multilayer nano-sheet stack 450 can include a semiconductor layer similar to substrates 402A and 402B, such as Si, Ge, or SiGe. In some embodiments, multilayer nano-sheet stack 450 can include alternating pairs of a first and a second nano-sheet layers vertically grown on top of each other. For example, multilayer nano-sheet stack 450 can include alternating pairs of a nano-sheet layer 404 and a nano-sheet layer 456. Nano-sheet layers 404 and 456 can be epitaxially and vertically grown on top of each other and over substrates 402A and 402B. In some embodiments, nano-sheet layers 404 and 456 can each have a same crystallographic orientation as top surfaces of substrate 402A and 402B (e.g., top surface 102t of substrate 102). Although FIGS. 4A and 4B exhibit four pairs of nano-sheet layers, any number of nano-sheet layers can be included in multilayer nano-sheet stack 450. In some embodiments, each layer in multilayer nano-sheet stack 450 can be grown by (i) chemical vapor deposition (CVD), such as low pressure CVD (LPCVD), atomic layer CVD (ALCVD), ultra-high vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, each layer in multilayer nano-sheet stack 450 can be in-situ doped during the epitaxial growth using p-type or n-type dopants. In some embodiments, p-type doping precursors such as, but are not limited to, diborane ($B_2H_6$), boron trifluoride ($BF_3$), and/or other p-type doping precursors can be used to provide the p-type dopants during the epitaxial growth. In some embodiments, n-type doping precursors such as, but are not limited to, phosphine ($PH_3$), arsine ($AsH_3$), and/or other n-type doping precursors can be used to provide the n-type dopants during the epitaxial growth. In some embodiments, each nano-sheet layer of multilayer nano-sheet stack 450 can be ex-situ doped using a ion implantation process.

Nano-sheet layers 404 and 456 can include a semiconductor material similar to or the same as substrates 402A and 402B (e.g., different portions of substrate 102). For example, nano-sheet layers 404 and 456 can include Si, Ge, SiGe, and III-V compound semiconductors (e.g., GaAs, InP, GaP, GaN, etc.). For example, nano-sheet layers 404 and 456 in method 300 can be respectively SiGe and Si epitaxial layers. Based on the disclosure herein, other materials, as discussed above, can be used. These materials are within the spirit and scope of this disclosure. In some embodiments, nano-sheet layer 404 can include SiGe containing from about 10% to about 50% Ge. Since each nano-sheet layer 404 and each nano-sheet layer 456 can be grown independently, nano-sheet layers 404 and nano-sheet layers 456 can have the same or different thickness from each other. Further, nano-sheet layers 404 can have the same or different thickness from each other, and similarly nano-sheet layers 456 can have the same or different thickness from each other. In some embodiments, nano-sheet layer 404 can have a thickness $404_t$ between about 5 nm and 15 nm. In some embodiments, a ratio of gate structure 110A's gate length $L_1$ (shown in FIG. 1A) to thickness $404_t$ (e.g., $L_1$: $404_t$) can be less than about 20, less than about 15, or less than about 10 to avoid shape deformation of nano-sheets 114A of the final resulting nano-sheet FET 100A (shown in FIG. 1A). In some embodiments, nano-sheet layer 556 can have a thickness $456_t$ between about 3 nm and 12 nm. In some embodiments, a ratio of gate structure 110A's gate length $L_1$ to thickness $456_t$ (e.g., $L_1$: $456_t$) can be less than about 20, less than about 15, or less than about 10 to avoid shape deformation of nano-sheets 114A of the final resulting nano-sheet FET 100A. Based on the disclosure herein, other thicknesses for each layer in multilayer nano-sheet stack 450 are within the scope and spirit of this disclosure.

Next, referring to FIGS. 5A and 5B, multilayer nano-sheet stack 450 can be etched to form vertical structures 506A and 506B. For example, vertical structures 506A and 506B can be formed by patterning a hard mask stack 510 over multilayer nano-sheet stack 450, and subsequently etching multilayer nano-sheet stack 450 defined by the patterned hard mask stack 510. In some embodiments, hard mask stack 510 can include a masking layer 512 and a pad layer 514 disposed over masking layer 512. Masking layer 512 can be a thin film including silicon oxide acting as an adhesion layer between multilayer nano-sheet stack 450 and pad layer 514. Masking layer 512 can also act as an etch stop for etching pad layer 514. In some embodiments, masking layer 512 can be formed using a thermal oxidation process. In some embodiments, masking layer 512 can range from about 1 nm to about 20 nm. Pad layer 514 can be a silicon nitride acting as a hard mask during the subsequent process of forming vertical structures 506A and 506B. In some embodiments, pad layer 514 can be formed using low pressure chemical vapor deposition (LPCVD), plasma enhanced CVD (PFCVD), atomic layer deposition (ALD), e-beam evaporation, or physical vapor deposition (PVD).

In some embodiments, hard mask stack 510 can have a thickness between 5 nm and 100 nm. The patterning of hard mask stack 510 can include blanket depositing a dielectric stack (e.g. oxide layer 512 and nitride layer 514) over multilayer nano-sheet stack 450, and subsequently etching the deposited dielectric stack using a photoresist layer patterned by a photolithography process. In some embodiments, the patterned hard mask stack 510 can be oriented along the x-axis, as shown in FIGS. 5A and 5B. In some embodiments, the patterned hard mask stack 510 can be oriented along the <110>, <111>, or <100> crystal direction. Patterned hard mask stack 510 can be used as an etch mask for removing multilayer nano-sheet stack 450 and substrates 402A and 402B in a subsequent etching process. During the etching process, regions of multilayer nano-sheet stack 450, which are not masked by the patterned hard mask stack 510, can be removed to form vertical structures 506A and 506B, and form trenches surrounding vertical structures 506A and 506B, where the trenches can be a space occupied by STI regions 504A and 504B described at a subsequent fabrication stage. As shown in FIGS. 5A and 5B, each of vertical structures 506A and 506B can respectively include multilayer nano-sheet stack 550A and 550B formed by the etching of multilayer nano-sheet stack 450. In some embodiments, regions of substrates 402A and 402B that underlie the etched regions of multilayer nano-sheet stack 450 can be further etched by the etching process, thus forming buffer regions 522A and 522B. In some embodiments, the etching process forms vertical structures 506A and 506B.

In some embodiments, vertical structures 506A and 506B can be formed using separated etching processes with one or more patterned hard mask stacks (not shown in FIGS. 5A and 5B). Accordingly, widths $W_1$ and $W_2$ of the patterned hard mask stack 510 and an etching depths $H_1$ and $H_2$ can respectively define the width and the height of vertical structures 506A and 506B. In some embodiments, vertical structures 506A and 506B can respectively have widths $W_1$ and $W_2$ that are between about 5 nm and about 150 nm. In some embodiments, vertical structures 506A and 506B can respectively have widths $W_1$ and $W_2$ that are between about 20 nm and about 100 nm. In some embodiments, vertical structures 506A and 506B can respectively have heights $H_1$ and $H_2$ that are between about 20 nm and about 200 nm. In some embodiments, vertical structures 506A and 506B can respectively have heights $H_1$ and $H_2$ that are between about 30 nm and about 150 nm. In some embodiments, vertical structures 506A and 506B can respectively have heights $H_1$ and $H_2$ that are between about 35 nm and about 80 nm. In some embodiments, vertical structure 506A's height $H_1$ can be different from vertical structure 506B's height $H_2$. In some embodiments, vertical structure 506A's width $W_1$ can be different from vertical structure 506B's width $W_2$. In some embodiments, orientations of vertical structures 506A and 506B can be the same as the patterned hard mask stack 510.

The etching process for removing hard mask stack 510, multilayer nano-sheet stack 450, vertical structures 506A and 506B, and substrates 402A and 402B can be a dry etch process, a wet etch process, or a combination thereof. In some embodiments, the dry etch process can include using a plasma dry etch using a gas mixture having octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure ranging from about 1 mTorr to about 500 mTorr. In some embodiments, the wet etch process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. In some embodiments, the etching process can selectively remove vertical structures 506A and 506B from hard mask stack 510. In some embodiments, the etching process can selectively remove substrates 402A and 402B from hard mask stack 510. In some embodiments, the etching process can selectively remove hard mask stack 510 from vertical structures 506A and 506B or from substrates 402A and 402B. Based on the disclosure herein, other gas species or chemicals for the etching process are within the scope and spirit of this disclosure.

Further, STI regions 504A and 504B can be formed adjacent to vertical structures 506A and 506B. For example, an insulating material can be blanket deposited over and between each vertical structures 506A and 506B. The insulating material can be blanket deposited to fill the trenches (e.g., the space that will be occupied by STI regions 504A and 504B in subsequent fabrication steps) surrounding vertical structures 506A and 506B. A subsequent polishing process, such as a chemical mechanical polishing (CMP) process, can substantially coplanarize (not shown) top surfaces of STI regions 504A and 504B with top surfaces of patterned hard mask stack 510. In some embodiments, the insulating material for STI regions 504A and 504B can include, for example, silicon oxide, silicon nitride, silicon oxynitride, fluoride-doped silicate glass (FSG), or a low-k dielectric material. In some embodiments, the insulating material for STI regions 504A and 504B can be deposited using a flowable chemical vapor deposition (FCVD) process, a high-density-plasma (HDP) CVD process, using silane ($SiH_4$) and oxygen (02) as reacting precursors. In some embodiments, the insulating material for STI regions 504A and 504B can be formed using a sub-atmospheric CVD (SACVD) process or high aspect-ratio process (HARP), where process gases can include tetraethoxysilane (TEOS) and/or ozone (03). In some embodiments, the insulating material for STI regions 504A and 504B can be formed using a spin-on-dielectric (SOD), such as hydrogen silsesquioxane (HSQ) or methyl silsesquioxane (MSQ).

In some embodiments, multiple fin isolation structures 112 can be optionally formed adjacent to vertical structures 506A and 506B. By way of example and not limitation, a process of forming fin isolation structure 112 can include removing a portion of multilayer nano-sheet stack 450 and a portion substrates 402A and 402B to form multiple recesses. The process of forming fin isolation structure 112 can further include filling the multiple recesses with an insulating material, such as a low-k dielectric. Hard mask stack 510 can then be patterned to respectively define locations of fin isolation structures 112 and vertical structures 506A and 506B. As a result, vertical structures 506A and 506B and fin isolation structures 112 can be formed by the previously described etching process using the patterned hard mask stack 510. In some embodiments, as shown in FIG. 5A, fin isolation structure 112 can be formed adjacent to vertical structure 506A with STI region 504A in between. Similarly, STI region 504B can be formed between vertical structure 506B and fin isolation structure 112, as illustrated in FIG. 5B. Based on the disclosure herein, other processes for forming fin isolation structure 112 are within the scope and spirit of this disclosure.

In some embodiments, without growing multilayer nano-sheet stack 450, operation 310 can begin with patterning substrate 402A and 402B to form the vertical structures for the first and second FETs. For example, operation 310 can begin by depositing hard mask stack 510 on substrates 402 and 402B. Subsequently, vertical structures 506A and 506B can be formed by patterning the deposited hard mask stack 510 and etching substrates 402A and 402B using the patterned hard mask stack 510.

Referring to FIG. 4, in operation 320, the vertical structures for the second FETs are removed to form first recess structures. For example, in referring to FIGS. 5B, 6A, and 6B, vertical structure 506B for finFET 100B can be etched to form recess 601. In some embodiments, vertical structure 506B can be partially etched to form recess 601 above vertical structure 606B. In some embodiments, vertical structure 506B can be completely etched to expose substrate 402B to form recess 601. In some embodiments, vertical structure 506B can be completely etched followed by partially etching substrate 402B to form recess 601. In some embodiments, vertical structure 506B can be etched, while vertical structure 506A and/or substrate 402A can be masked by hard mask stack 510. The process of forming recess 601 can include removing portions of hard mask stack 510 over substrate 402B. In some embodiments, the removal of portions of hard mask stack 510 can expose vertical structure 506B, STI region 504B, and fin isolation structures 112 adjacent to vertical structure 506B. In some embodiments, the removal of hard mask stack 510 can include patterning a photoresist layer (not shown) to mask portions of hard mask stack 510 over substrate 402A. Subsequently, the removal of hard mask stack 510 can include etching the portions of hard mask stack 510 above substrate 402B using the photoresist layer as an etch mask. As a result, hard mask stack 510 can be patterned to selectively mask vertical structure 506A and expose vertical structure 506B. In some embodiments, the patterned hard mask stack 510 can expose STI region 504A.

Figure 6A:
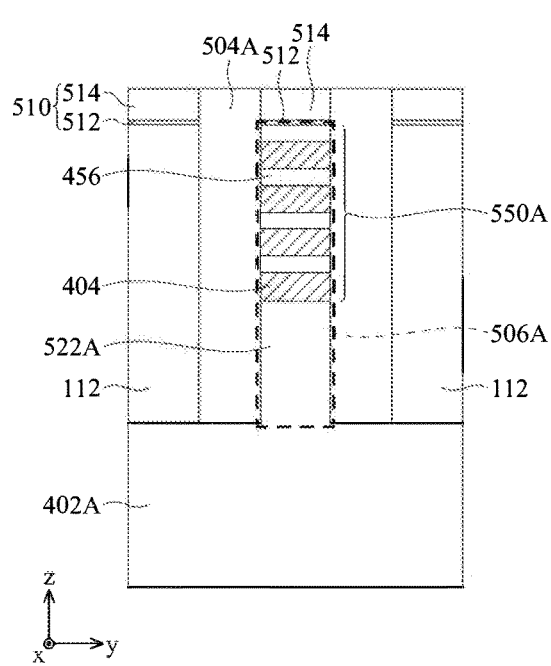
Figure 6B:
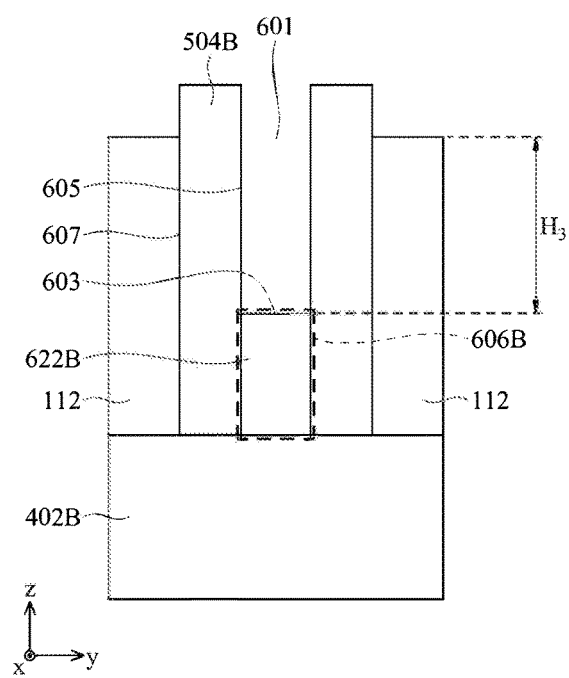

Further, the process of forming recess 601 can also include etching portions of multilayer nano-sheet stack 550B in vertical structure 506B to expose vertical structure 606B underneath, while using hard mask stack 510 to mask multilayer nano-sheet stack 550A in vertical structure 506A and fin isolation structure 112 above substrate 402A. In some embodiments, vertical structure 606B can include buffer region 622B that can have a material and a crystallinity similar (e.g., lattice mismatch less than 5%) or identical to substrate 402B. As shown in FIG. 6B, recess 601 can have a bottom surface 603 and side surfaces 605. As such, bottom surface 603 can represent a top surface of vertical structure 606B exposed by recess 601. Accordingly, bottom surface 603 can include a material having a crystallinity similar (e.g., lattice mismatch less than 5%) or identical to vertical structure 606B (the portion of vertical structure 506B under nano-sheet stack 550B). In some embodiments, vertical structure 606B can further include a portion of multilayer nano-sheet stack 550B (not shown in FIG. 6B), where the process of forming recess 601 can include partially etching multilayer nano-sheet stack 550B above substrate 402B. For example, vertical structure 606B can further include nano-sheet layer 404 and/or nano-sheet layer 406 (both not shown in FIG. 6B). As such, bottom surface 603 can include a material having a crystallinity similar (e.g., lattice mismatch less than 5%) or identical to multilayer nano-sheet stack 550B. In some embodiments, the process of forming recess 601 can further include etching portions of substrate 402B underlying multilayer nano-sheet stack 550B in vertical structure 506B. As such, bottom surface 603 can represent a top surface of substrate 402B exposed by recess 601. Accordingly, bottom surface 603 can include a material having a crystallinity similar (e.g., lattice mismatch less than 5%) or identical to substrate 402B. In some embodiments, the process of forming recess 601 can include applying an etching process to expose side surfaces of STI region 504B or expose side surfaces 607 of fin isolation structure 112. In some embodiments, the process of forming recess 601 can include removing portions of STI regions 504A and 504B (e.g., STI regions 504A and 504B can be etched while etching multilayer nano-sheet stack 550B in vertical structure 506B). In some embodiments, the process of forming recess 601 can include preserving an integrity of STI regions 504A and 504B (e.g., STI regions 504A and 504B are not etched during the etching process for removing multilayer nano-sheet stack 550B). By way of example and not limitation, the etching process used in the process of forming recess 601 can be an etching process using similar techniques used to remove hard mask stack 510, vertical structures 506A and 506B, and substrate 402A and 402B. In some embodiments, the etching process can selectively remove vertical structure 506B from hard mask stack 510. In some embodiments, the etching process can selectively remove substrate 402B from hard mask stack 510.

In some embodiments, recess 601 can have depth $H_3$ (e.g., not including thickness of hard mask stack 510) less than or equal to about height $H_1$ (shown in FIG. 5A) of vertical structures 506A or height $H_2$ (shown in FIG. 5B) of vertical structure 506B. For example, recess 601 can have depth $H_3$ between about 30 nm and 90 nm. In some embodiments, recess 601 can have depth $H_3$ greater than about height $H_1$ of vertical structures 506A or height $H_2$ (shown in FIG. 5B) of vertical structure 506B. For example, recess 601 can have depth $H_3$ greater than about 90 nm.

In some embodiments, operation 320 can further include trimming vertical structure 506A for nano-sheet FET 100A (not shown in FIGS. 6A and 6B) using a similar process as etching vertical structure 506B as described above.

Figure 7A:
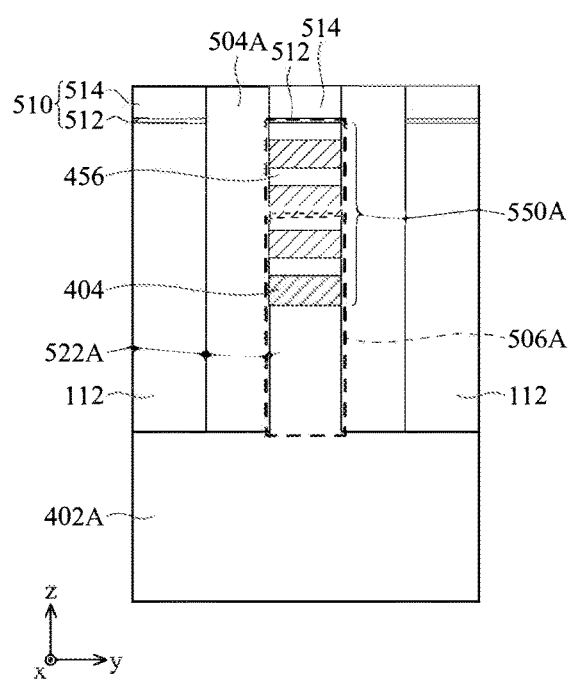
Figure 7B:
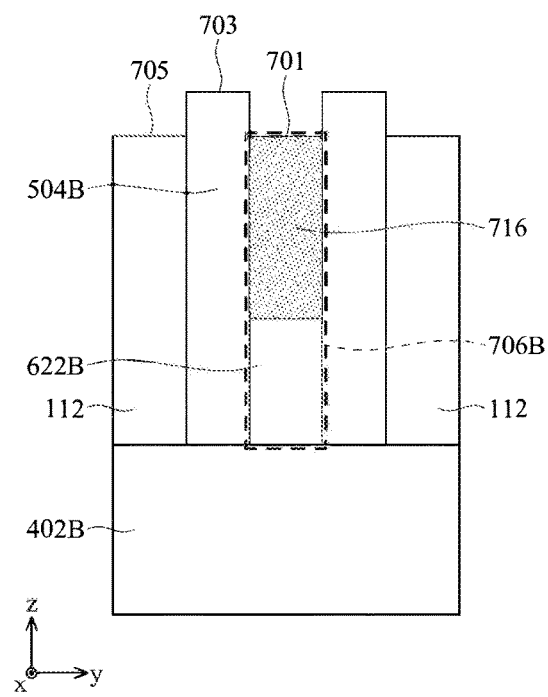

Referring to FIG. 4, in operation 330, a channel layer is formed over each of the first recess. For example, as shown in FIGS. 6B and 7B, channel layer 716 can be selectively grown over recess 601's bottom surface 603 to form vertical structure 706B for finFET 100B. In some embodiments, channel layer 716 can be selectively grown over vertical structure 606B while masking vertical structure 506A with hard mask stack 510 (shown in FIG. 7A). In some embodiments, channel layer 716 can substantially fill recess 601. In some embodiments, channel layer 716 can be grown a portion of substrate 402B exposed by recess 601. In some embodiments, a top surface 701 of channel layer 716 can be below top surfaces 703 of adjacent STI region 504B. In some embodiments, top surface 701 can be substantially coplanar with top surfaces 705 of adjacent fin isolation structure 112. In some embodiments, top surface 701 of channel layer 716 can be flat and parallel to substrate 402B's crystal plane. In some embodiments, top surface 701 of channel layer 716 can be parallel to (100) crystal plane. In some embodiments, top surface 701 of channel layer 716 can include one or more (111) crystal facets.

Channel layer 716 can be grown and/or in-situ doped by using similar techniques as growing multilayer nano-sheet stack 450. In some embodiments, channel layer 716 can be grown by an epitaxial deposition/partial etch process, which repeats the epitaxial deposition/partial etch process at least once. Such repeated deposition/partial etch process can be also called a "cyclic deposition-etch (CDE) process." In some embodiments, channel layer 716 can be grown by selective epitaxial growth (SEG), where an etching gas (e.g., HCl, $H_2$, $CH_4$, or Ar) can be added to promote the selective growth of semiconductor material on bottom surface 603, but not on insulating material (e.g., hard mask stack 510 and/or STI regions 504A and 504B). In some embodiments, channel layer 716 can be ex-situ doped with an ion implantation process.

Channel layer 716 can be made of a material similar to substrate 402B. For example, channel layer 716 can include a crystalline semiconductor layer where a lattice mismatch between the crystalline semiconductor layer and substrate 402B can be within, for example, 5%. In some embodiments, channel layer 716 can include (i) elementary semiconductor, such as Si or Ge; (ii) a compound semiconductor including silicon carbide, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof. In some embodiments, channel layer 716 can include a multilayer stack (e.g., similar to multilayer nano-sheet stack 450).

Figure 8A:
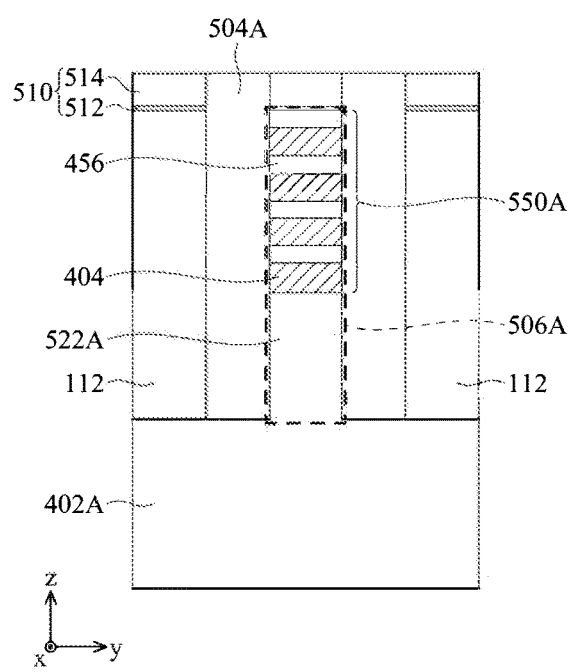
Figure 8B:
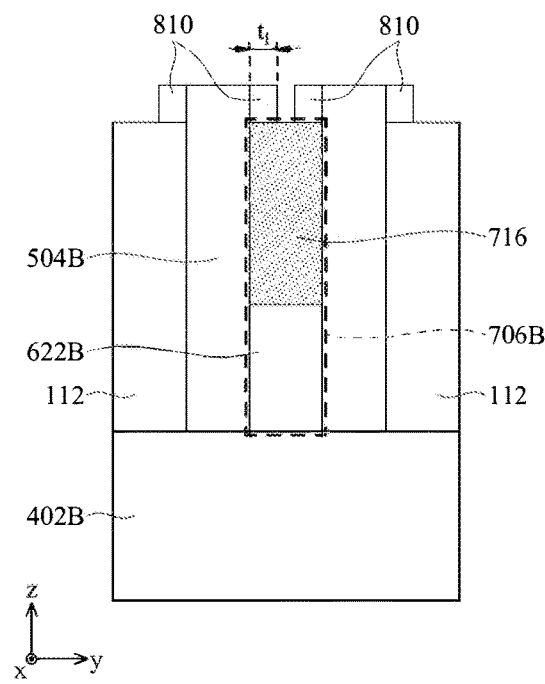

Referring to FIG. 4, in operation 340, a second recess structure is formed in the channel layer. FIGS. 8A-10A and 8B-10B are cross-sectional views of partially fabricated structures that can be used to described the fabrication stages of operation 440. As shown in FIGS. 8B and 9B, a recess 901 (shown in FIG. 9B) can be formed in vertical structure 706B (shown in FIG. 8B) that contains channel layer 716. Further, STI regions 104B can be formed within recess 901 (shown in FIG. 10B).

The process of forming recess 901 can include forming spacers 810 over a portion of channel layer 716 and subsequently etching-back channel layer 716 using spacers 810 as etch masks. In referring to FIGS. 8A and 8B, each spacer 810 can be formed adjacent to STI regions 504B to cover portions of channel layer 716 adjacent to STI regions 504B. For example, spacers 810 can cover edge portions of channel layer 716 adjacent to STI regions 504B, and expose a central portion of channel layer 716 surrounded by the edge portions of channel layer 716. A process of forming spacers 810 can include blanket deposition of an insulating material (e.g., an oxide or a nitride material) over structures of FIGS. 7A and 7B (e.g., over substrates 402A and 402B) using similar techniques as forming pad layer 514 followed by an anisotropic etching of the deposited insulating material. As illustrated in FIG. 8A, since STI region 504A can be coplanar with hard mask stack 510, the anisotropic etching process can substantially remove the deposited insulating material over substrate 402A. On the other hand, since top surface 703 of STI region 504B can be higher than top surface 701 of channel layer 716, spacers 810 can be formed over portions of channel layer 716 that are adjacent to STI region 504B. In some embodiments, the anisotropic etching can expose STI region 504A. In some embodiments, the anisotropic etching process can be similar to the techniques used to remove hard mask stack 510. In some embodiments, the anisotropic etching process can remove the deposited insulating layer without affecting an integrity of hard mask stack 510. For example, an etching time of the anisotropic process can be optimized to form spacers 810 without completely removing hard mask stack 510. In some embodiments, each spacer 810 can have a thickness ti between about 5 nm and about 15 nm.

The process of forming spacers 810 can be followed by using an etching-back process to remove portions of vertical structure 706B that are exposed by spacers 810 (shown in FIG. 9B), while vertical structure 506A can be masked by hard mask stack 510 (shown in FIG. 9A). For example, the etching-back process can form recess 901 within channel layer 716, while vertical structure 506A can be masked and protected by hard mask stack 510. The process of forming recess 901 can split channel layer 716 into two channel layers 914B and 914C. In some embodiments, the etching back process can further remove buffer region 622B underlying the etched portions of channel layer 716. In other words, the process of forming recess 901 can split buffer region 622B into two buffer regions 922B and 922C. As a result, as shown in FIG. 9B, the process of forming recess 901 can form two vertical structures 906B and 906C, where each of vertical structures 906B and 906C can include channel layers 914B and 914C and buffer regions 922B and 922C. In some embodiments, recess 901 can have a width $W_3$ smaller than a width $W_2$ (shown in FIG. 5B) of vertical structure 506B. For example, width $W_3$ can be about a difference between vertical structure 506B's $W_2$ and twice of spacer 810's ti. In some embodiments, width $W_3$ can be less than about 90 nm. In some embodiments, width $W_3$ can be smaller than a separation (not shown in FIGS. 9A and 9B) between vertical structure 506A and vertical structure 906B, or a separation between vertical structure 506A and vertical structure 906C.

The etching-back process can include a dry etching process that selectively etches channel layer 716 from spacers 810 and STI regions 504A and 504B. By way of example and not limitation, the dry etching process can include a biased etching process performed under a pressure of about 1 mTorr to about 1000 mTorr, at a power of about 50 W to about 1000 W, at a bias voltage of about 20 V to about 500 V, at a temperature of about 40° C. to about 60° C., and using HBr and/or $Cl_2$ as etch gases. In some embodiments, the etching-back process can include an etching process using similar techniques used to remove multilayer nano-sheet stack 550B. In some embodiments, hard mask stack 510 can protect vertical structure 506A from being etched during the etching-back of channel layer 716.

In some embodiments, in operation 340, the second recess structure can include forming multiple recess structures 901 over substrate 402B. The process of forming the multiple recess structures 901 can include forming multiple mask layers (not shown) over channel layer 716 and subsequently etching-back channel layer 716 using the multiple mask layers. By way of example and not limitation, the formation of mask layers can include patterning a photoresist on channel layer 716 using photolithography, and the etching-back of channel layer 716 can be performed via a dry etching process or a wet etching process.

Next, STI regions 104B can be formed within recess 901 using similar materials and processes as STI regions 504A and 504B. For example, as shown in FIG. 10B, recess 901 can be partially filled with a dielectric material to form STI region 104B. The process of filling recess 901 can include blanket depositing the dielectric material in recess 901, such as covering recess 901's bottom surface and recess 901's side surfaces, using a deposition process, where the dielectric material and the deposition process can be similar to those associated with forming STI regions 504A and 504B. In some embodiments, the deposition process for filling recess 901 can concurrently blanket deposit the dielectric material over substrate 402A (not shown in FIGS. 10A-10B) during the deposition process.

The process of filling recess 901 can further include etching the deposited dielectric material using a etching process to expose a portion of recess 901's side surfaces, while covering recess 901's bottom surface with the dielectric material. The etching process can concurrently etch STI region 504B to form STI region 104B. In some embodiments, the process can also concurrently etch STI regions 504A to form STI regions 104A. In some embodiments, the etching process can include a wet etching process using hydrofluoric acid (HF). In some embodiments, the etching process can include a dry etch using $CHF_3$ or $BF_3$ as etching gas. Subsequently, hard mask stack 510 that masks substrate 402A and spacers 810 that masks channel layers 914B and 914C can be removed using a similar technique as patterning hard mask stack 510.

Figure 10A:
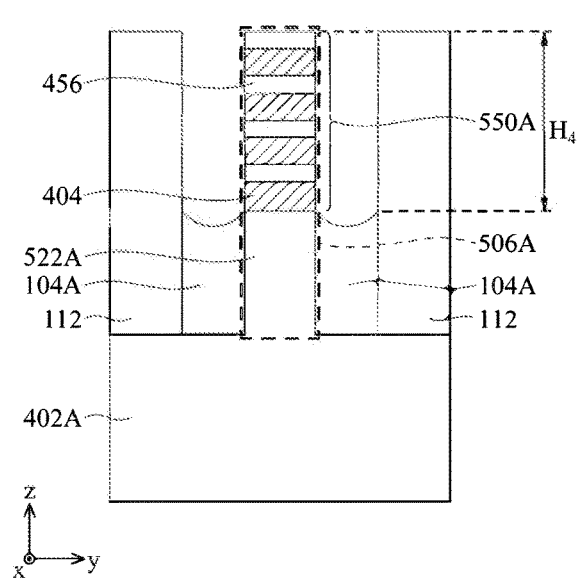
Figure 10B:
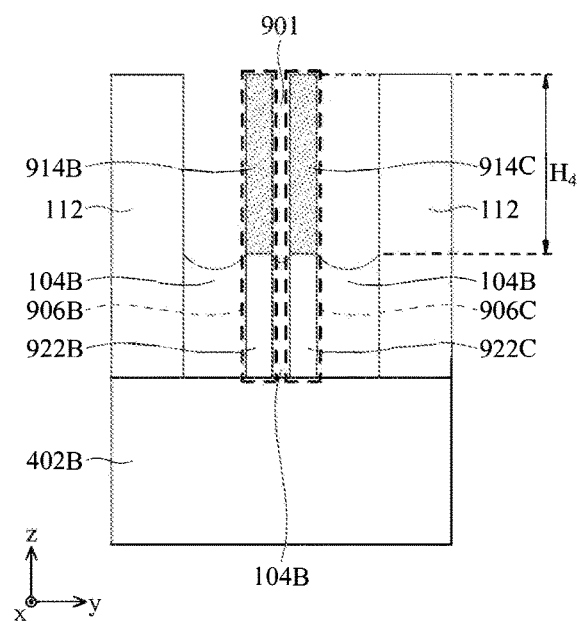

After operation 340, as shown in FIGS. 10A and 10B, upper portions of vertical structures 506A, 906B, and 906C can protrude over top surfaces of STI regions 104A and 104B. In some embodiments, multilayer nano-sheet stack 550A in vertical structure 506A, channel layer 914B in vertical structure 906B, and channel layer 914C in vertical structure 906C can protrude over top surfaces of STI regions 104A and 104B. In some embodiments, a vertical dimension $H_4$ of each the upper portions of vertical structures 506A, 906B, and 906C that protrude STI regions 104A and 104B can be between about 15 nm and about 120 nm.

The configuration in FIGS. 10A and 10B can be referred to herein as a "hybrid" configuration, where vertical structure 506A with multilayer nano-sheet stack 550A can be formed with vertical structure 906B (e.g. fin 906B) with channel layer 914B on a same substrate (e.g., substrates 402A and 402B). According to some embodiments, nano-sheet FETs can be formed on multilayer nano-sheet vertical structure 506A, while finFETs can be formed on vertical structure 906B (e.g. fin 906B). As discussed above, different arrangements of vertical structures 506A and 906B on the same substrate are possible; for example, an array of multilayer nano-sheet vertical structures 506A, an array of Si fins 906B, or combinations thereof. Consequently, combinations of nano-sheet FETs 100A and finFETs 100B can be formed across substrate 102.

Figure 11A:
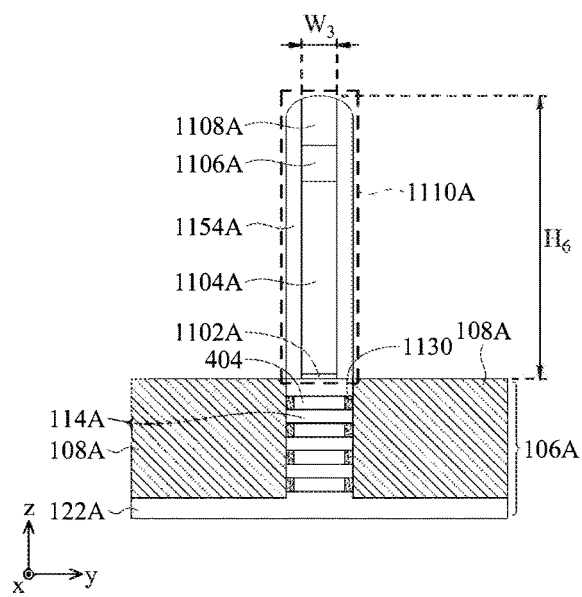
Figure 11B:
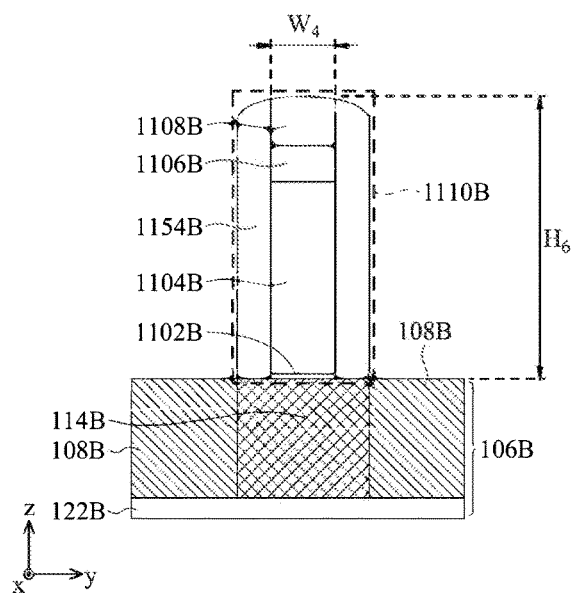

Referring to FIGS. 5, 11A, and 11B, method 300 continues with operation 350 to form sacrificial gate structures and source/drain regions over the structures of FIGS. 10A and 10B. Namely, sacrificial gate structures 1110A and 1110B, and S/D regions 108A and 108B can be formed for nano-sheet FET 100A and finFET 100B. In some embodiments, sacrificial gate structures 1110A and 1110B can be concurrently formed for nano-sheet FET 100A and finFET 100B. In some embodiments, sacrificial gate structures 1110B can be concurrently formed in recess 901, channel layers 914B and 914C. In some embodiments, S/D regions 108A and 108B can be concurrently formed for nano-sheet FET 100A and finFET 100B.

Sacrificial gate structures 1110A and 1110B can include sacrificial gate electrodes 1104A and 1104B, spacers 1154A and 1154B, and sacrificial gate dielectrics 1102A and 1102B. In some embodiments, sacrificial gate electrodes 1104A and 1104B can further include capping layers 1106A and 1106B and oxide layers 1108A and 1108B. By way of example and not limitation, sacrificial gate dielectrics 1102A and 1102B can be deposited prior to sacrificial gate electrodes 1104A and 1104B and can be interposed between vertical structures 506A and 906B and sacrificial gate electrodes 1104A and 1104B. According to some embodiments, sacrificial gate dielectrics 1102A and 1102B can include $SiO_2$ or SiON and can be replaced with a high-dielectric constant (high-k) dielectric material in a subsequent gate structure replacement operation. Further, sacrificial gate electrodes 1104A and 1104B can include polycrystalline silicon (polysilicon) and can be replaced with a metal gate electrode stack in a subsequent gate structure replacement operation. By way of example and not limitation, sacrificial gate dielectrics 1102A and 1102B and sacrificial gate electrodes 1104A and 1104B can be deposited as blanket layers and patterned with photolithography and etching operations to form sacrificial gate structures 1110A and 1110B over vertical structures 506A and 906B and STI regions 104A and 104B (not shown in FIGS. 11A and 11B).

As previously discussed, nano-sheet FET 100A can have a short gate length (e.g., $L_1 \leq 100$ nm, shown in FIG. 1A) to avoid deformation of nano-sheets 114A. Meanwhile, there is no such limitation for a gate length of finFET 100B. As a result, a length $L_4$ of sacrificial gate electrode 1110B for finFET 100B can be longer or equal to a length $L_3$ of sacrificial gate electrode 1110A for nano-sheet FET 100A. For example, sacrificial gate electrode 1110A can have a length $L_3$ less than or equal to about 100 nm, while sacrificial gate electrode 1110B can have a length $L_4$ larger than 100 nm. In some embodiments, sacrificial gate electrode 1110A's length $L_3$ can be between 3 nm and 150 nm. In some embodiments, sacrificial gate electrode 1110A's length $L_3$ can be between 5 nm and 120 nm. In some embodiments, sacrificial gate electrode 1110A's length $L_3$ can be between 5 nm and 100 nm. In some embodiments, sacrificial gate electrode 1110B's length $L_4$ can be between 5 nm and 10000 nm. In some embodiments, sacrificial gate electrode 1110B's length $L_4$ can be between 10 nm and 1000 nm. In some embodiments, sacrificial gate electrode 1110B's length $L_4$ can be between 100 nm and 1000 nm.

Spacers 1154A and 1154B can function as masks in an epitaxial growth process and/or an ion implantation process for the formation of the source/drain junctions on vertical structures 506A and 906B. By way of example and not limitation, spacers 1154A and 1154B can be deposited as a blanket film which can be etched with an etchback process to form spacers 1154A and 1154B on the sidewalls of sacrificial gate structures 1110A and 1110B. In some embodiments, the etchback process can be an anisotropic etch that removes the spacer material faster on horizontal surfaces (e.g., on the x-y plane) compared to vertical surfaces (e.g., on the y-z or x-z planes). Since the spacer material is blanket deposited, it can cover the exposed surfaces vertical structures 506A and 906B. A sidewall pull back process can remove the spacer material from the vertical structure's sidewall surfaces.

In some embodiments, spacers 1154A and 1154B can include a dielectric material, such as $SiO_2$, SiON, SiCN, silicon oxy-carbide (SiOC), or SiN. In some embodiments, the thickness of spacers 1154A and 1154B can range from about 2 nm to about 5 nm. Spacers 1154A and 1154B can be a stack of one or more layers that include the same or different materials. According to some embodiments, spacers 1154A and 1154B can remain during the metal gate replacement process and can function as structural elements for the metal gate structure that will replace sacrificial gate structures 1110A and 1110B.

It is noted that additional sacrificial gate structures (e.g., like sacrificial gate structures 1110A and 1110B) can be formed parallel to sacrificial gate structures 1110A and 1110B and perpendicular to a projection of vertical structures 506A and 906B along the x-axis. Therefore, FIGS. 11A and 11B can include additional sacrificial gate structures 1110A and 1110B parallel to each other and on vertical structures 506A and 906B.

The process of forming spacers 1154A and 1154B can be followed by an etch back of portions of vertical structures 506A and/or 906B that are not covered by respective sacrificial gate structures 1110A and 1110B. The etching back of vertical structures 506A and/or 906B respectively forms vertical structures 106A and/or 106B. For example, the etching back of vertical structures 506A and/or 906B can trim nano-sheet layers 456, channel layer 914B, buffer region 522A, and buffer regions 922B to respectively form channel region 114A, channel region 114B, buffer region 122A, and buffer region 122B. In some embodiments, a biased etching process can be performed to etch back these portions of vertical structures 506A and/or 906B. The etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, sacrificial gate structures 1110A and 1110B can be protected from being etched by respective capping layers 1106A and 1106B and oxide layer 1108A and 1108B.

The etch back process can be followed by the epitaxial growth of S/D regions 108A and 108B on the recessed portions of respective vertical structures 506A and 906B to respectively form vertical structures 106A and 106B. S/D regions 108A and 108B can be grown concurrently or separately. In some embodiments, S/D regions 108A and 108B can be grown using similar techniques as growing multilayer nano-sheet stack 450. In some embodiments, S/D regions 108A and 108B can be grown by an epitaxial deposition/partial etch process, which repeats the epitaxial deposition/partial etch process at least once. Such repeated deposition/partial etch process can be also called a "cyclic deposition-etch (CDE) process." In some embodiments, S/D regions 108A and 108B can be grown by selective epitaxial growth (SEG), where an etching gas is added to promote the selective growth of semiconductor material on the recessed portions of respective vertical structures 506A and 906B, but not on insulating material (e.g., dielectric material of STI regions 104A and 104B).

In some embodiments, S/D regions 108A and 108B can be grown to have a thickness similar to the thickness of multilayer nano-sheet stacks 550A or 550B. In some embodiments, S/D regions 108A and 108B can have a thickness similar to the thickness of channel layer 716. In some embodiments, S/D regions 108A and 108B can have a substantially equal or different thickness from each other. Based on the disclosure herein, other thicknesses for S/D regions 108A and 108B are within the scope and spirit of this disclosure.

In some embodiments, S/D regions 108A and 108B can be doped using an implantation process (e.g., ex-situ doping). In some embodiments, S/D regions 108A and 108B can be doped during the growth of S/D regions 108A and 108B (e.g., in-situ doped). For p-type in-situ doping, p-type doping precursors can include, but are not limited to, diborane ($B_2H_6$), boron trifluoride ($BF_3$), and/or other p-type doping precursors can be used. For n-type in-situ doping, n-type doping precursors can include, but are not limited to, phosphine ($PH_3$), arsine ($AsH_3$), and/or other n-type doping precursor can be used.

In some embodiments, S/D regions 108A and 108B can each have multiple sub-regions as previously described. By way of example and not limitation, the sub-regions of S/D regions 108A and 108B can be epitaxially grown under a pressure of about 10 Torr to about 300 Torr and at a temperature of about 500° C. to about 700° C. using reaction gases such as HCl as an etching agent, $GeH_4$ as Ge precursor, dichlorosilane (DCS) and/or $SiH_4$ as Si precursor, $B_2H_6$ as B dopant precursor, $H_2$, and/or $N_2$. To achieve different concentration of Ge in the sub-regions, the ratio of a flow rate of Ge to Si precursors is varied during their respective growth process, according to some embodiments. For example, a Ge to Si precursor flow rate ratio in a range from about 9 to about 25 can be used during the epitaxial growth of the sub-regions closest to substrates 402A and 402B, while a Ge to Si precursor flow rate ratio less than about 6 can be used during the epitaxial growth of the sub-regions farthest from substrates 402A and 402B.

In some embodiments, instead of the etch back of the portions of vertical structures 506A and 906B and the subsequent growth of S/D regions 108A and 108B on the recessed portions of vertical structures 506A and 906B, S/D regions 108A and 108B can be epitaxially grown on respective vertical structures 506A and 906B that can extend above STI regions 104A and 104B and are not covered by respective sacrificial gate structures 1110A and 1110B.

In some embodiments, as shown in FIG. 11A, the process of forming spacer 1154A can further include forming inner spacers 1130 between each nano-sheet layer 404 and S/D region 108A. The process of forming inner spacer 1130 can include laterally recessing each nano-sheet layer 404 and subsequently filling the recess with a dielectric material. The laterally recessing can be conducted using an etching process that selectively removes nano-sheet layers 404 from channel region 114A. The filling of the recess with the dielectric material can use similar techniques as forming spacers 1154A and 1154B.

Figure 12A:
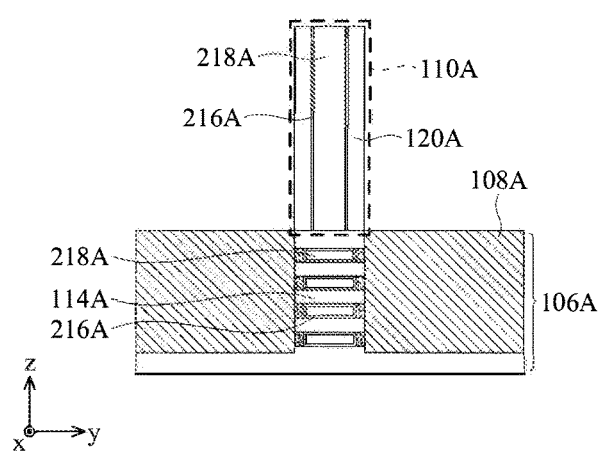
Figure 12B:
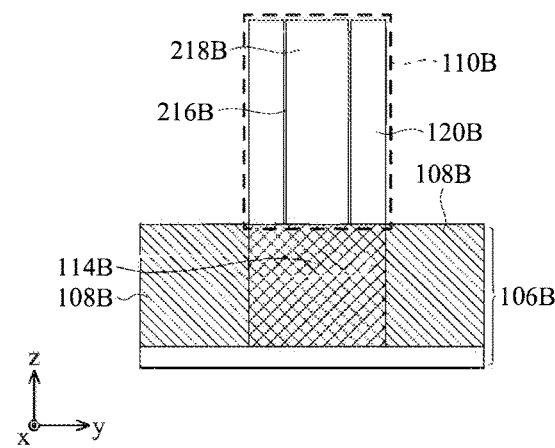

Referring to FIG. 3, in operation 360, sacrificial gate structures are replaced with metal-gate structures. For example, as shown in FIGS. 12A and 12B, sacrificial gate structures 1110A and 1110B can be replaced with metal gate structures 110A and 110B. Operation 360 can begin with removing sacrificial gate electrodes 1104A and 1104B and sacrificial gate dielectrics 1102A and 1102B using a dry etching process (e.g., reaction ion etching) or a wet etching process. In some embodiments, portions of channel region 114A (e.g., nano-sheet layers 114A) and channel region 114B (e.g., finFET 100B's channel 114B) that underlie sacrificial gate electrodes 1104A and 1104B can be exposed after the removal of 1104A and 1104B and sacrificial gate dielectrics 1102A and 1102B.

In some embodiments, the gas etchants used in the dry etching process for removing sacrificial gate electrodes 1104A and 1104B and sacrificial gate dielectrics 1102A and 1102B can include $Cl_2$, fluorine (F), bromine ($Br_2$), or a combination thereof. In some embodiments, the wet etching process for removing sacrificial gate electrodes 1104A and 1104B and sacrificial gate dielectrics 1102A and 1102B can include a dual wet etching process during which sacrificial gate electrode 1104A and 1104B and sacrificial gate dielectrics 1102A and 1102B can be removed sequentially. By way of example and not limitation, sacrificial gate structure 900 can be removed with a first wet etching process designed to be selective towards sacrificial gate electrodes 1104A and 1104B. For example, the selectivity of the first wet chemistry can be greater than about 1000:1 (e.g., 10000:1) so that spacers 1154A and 1154B, and sacrificial gate dielectrics 1102A and 1102B can be preserved after the first wet etching process. It is noted that since sacrificial gate dielectrics 1102A and 1102B can be interposed between vertical structures 106A and 106B and sacrificial gate electrode 1104A and 1104B, sacrificial gate dielectrics 1102A and 1102B can protect nano-sheet layers 404/114A and channel region 114B from being etched during the first wet etching process. Further referring to FIGS. 11A and 11B, a subsequent second wet etching process can remove sacrificial gate dielectrics 1102A and 1102B without etching spacers 1154A and 1154B and the vertical structures 106A and 106B. By way of example and not limitation, the second wet etching chemistry can be selective towards sacrificial gate dielectrics 1102A and 1102B so that surrounding materials, such as spacers 1154A and 1154B, nano-sheet layers 404 and 114A, and channel region 114B can be preserved. Based on the disclosure herein, other etching processes for removing sacrificial gate electrodes 1104A and 1104B and sacrificial gate dielectrics 1102A and 1102B are within the scope and spirit of this disclosure.

Next, operation 360 can proceed to remove each nano-sheet layers 404 within portions of vertical structure 106A between S/D region 108A using an etching process. The etching process can be a dry etching or a wet etching process that can be selective towards nano-sheet layer 404 and can have low/negligible etching rate towards nano-sheet layer 114A. For example, nano-sheet layer 404 can be a SiGe layer, and nano-sheet layer 114A can be a Si layer. A halogen-based gas can be applied to selectively etch nano-sheet layer 404 from nano-sheet layer 114A, since halogen-based chemistries can exhibit etch selectivity higher for Ge than for Si. In some embodiments, the halogen-based gases can include fluorine-based and/or chlorine-based gases. Similarly, a wet etch chemistry with high selectivity towards SiGe can be used. By way of example and not limitation, a wet etch chemistry can include a mixture of sulfuric acid ($H_2SO_4$) and hydrogen peroxide ($H_2O_2$) (SPM), or a mixture of ammonia hydroxide with $H_2O_2$ and water (APM). As a result, after the removal of nano-sheet layers 404, nano-sheet layers 114B can be suspended and disposed between spacers 1154A and 1154B. In some embodiments, the removal of each of nano-sheet layers 404 can expose top surface or a bottom surface of portions of each nano-sheet layer 114A within vertical structure 106A and between S/D regions 108A.

In some embodiments, the etching process used for removing nano-sheet layers 404 can have a negligible etching rate towards channel region 114B. In some embodiments, vertical structure 106B can be masked during the removal of nano-sheet layers 404.

Further, in operation 360, metal gate structure 110A and 110B can be formed over the exposed channel region 114A (e.g. nano-sheet layers 114A) and channel region 114B shown in FIGS. 12A and 12B. The process of forming metal gate structures 110A and 110B can include forming (i) an interfacial layer (not shown in FIGS. 12A and 12B), (ii) dielectric layer 216, such as a high-k dielectric (e.g., with a k-value greater than 3.9), and (iii) gate electrode 218. In some embodiments, the interfacial dielectric layers can be formed by chemical oxidation, thermal oxidation, atomic layer deposition (ALD), chemical vapor deposition (CVD), and/or other suitable formation processes. In some embodiments, dielectric layer 316 can be formed by CVD, ALD, physical vapor deposition (PVD), e-beam evaporation, or other suitable process. In some embodiments, gate electrode 218 can be formed using a suitable process, such as ALD, CVD, PVD, plating, or combinations thereof. In some embodiments, the process of forming metal gate structure 110A can include surrounding portions of each nano-sheet layers 114A between S/D regions 108A with dielectric layer 216 and gate electrode 218. In some embodiments, the process of forming metal gate structure 110B can include filling recess 901 with dielectric layer 216 and gate electrode 218, and surround top surface and side surfaces of channel region 114B, where channel region 114B's bottom surface can be in contact with substrate 102.

The deposited dielectric layer 216 and gate electrode 218 can be planarized by a polishing process (e.g., CMP). The polishing process can substantially coplanarize top surfaces of dielectric layer 216 and gate electrode 218 to form nano-sheet FET 100A and finFET 100B as described with respect to FIGS. 1A and 1B above. In some embodiments, the polishing process can trim spacers 1154A and 1154B to respectively form spacers 120A and 120B.

The present disclosure describes structures and methods for forming hybrid transistors on a same substrate. The hybrid transistors can include a nano-sheet FET and a finFET. By way of example and not limitation, the nano-sheet NFET can include Si nano-sheet layers and/or SiGe nano-sheet layers, while the finFET can include a Si fin structure, a SiGe fin structure, or a Si/SiGe stack fin structure. The example methods can form vertical structures respectively for the nano-sheet FET's channel region and the finFET's channel region. In some embodiments, the vertical structure for the finFET can be formed by trimming a vertical structure for the nano-sheet FET followed by growing finFET's channel stack over the trimmed vertical structure. Similarly, the vertical structure for the nano-sheet FET can be formed by trimming a vertical structure for the finFET followed by growing nano-sheet stack over the trimmed vertical structure. Due to the selective process, hybrid structures with nano-sheet FETs and finFETs can be concurrently formed on the same substrate. Further, such hybrid structure can exhibit nano-sheet FETs and finFETs with different gate lengths, widths, thicknesses, and channel stacks formed on the same substrate, according to some embodiments. As a result, the resulting hybrid transistor structures can provide a robust platform and flexible design window for the implementing integrated circuits with multiple functionalities (e.g., system on chip).

In some embodiments, a semiconductor device can include a fin field effect transistor (finFET) on a substrate, where the finFET includes: a first fin over the substrate; and a first gate structure disposed over a top and sides of a portion of the first fin; and a nano-sheet transistor on the substrate, where the nano-sheet transistor includes: a vertical structure over the substrate, where the vertical structure includes a plurality of nano-sheet layers; and a second gate structure surrounding a top, sides, and a bottom of each of the plurality of nano-sheet layers of the vertical structure, where a gate length of the second gate structure is shorter than a gate length of the first gate structure.

In some embodiments, a device can include a substrate; a field effect transistor (finFET) on the substrate, the finFET having a first channel length; and a gate-all-around FET (GAAFET) on the substrate, the GAAFET having a second channel length different from the first channel length, where the GAAFET and the finFET are arranged as neighboring transistors.

In some embodiments, a device can include a fin field effect transistor (finFET) on a substrate, where the finFET includes: a fin on the substrate; first source/drain regions extending from the fin; a first gate structure wrapped around a portion of the fin; and a plurality of side-by-side channels under the first gate structure and disposed between the first source/drain regions; and a gate-all-around transistor (GAAFET) on the substrate, where the GAAFET includes: a nano-sheet stack on the substrate; second source/drain regions extending from the nano-sheet stack; a second gate structure wrapped around a portion of the nano-sheet stack; and a plurality of vertically-stacked channels under the second gate structure and disposed between the second source/drain regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin field effect transistor (finFET) on a substrate, wherein the finFET comprises:
a first fin over the substrate; and
a first gate structure disposed over a top and sides of a portion of the first fin; and
a nano-sheet transistor on the substrate, wherein the nano-sheet transistor comprises:
a vertical structure over the substrate, wherein the vertical structure comprises a plurality of nano-sheet layers;
a shallow trench isolation region adjacent to the vertical structure and having a non-planar top surface; and
a second gate structure surrounding a top, sides, and a bottom of each of the plurality of nano-sheet layers of the vertical structure, wherein a gate length of the second gate structure is shorter than a gate length of the first gate structure.

2. The semiconductor device of claim 1, wherein a ratio of the gate length of the first gate structure to the gate length of the second gate structure is greater than about 2.

3. The semiconductor device of claim 1, wherein the first fin comprises a single semiconductor layer, wherein:
a bottom of the single semiconductor layer is in contact with the substrate; and
a top of the single semiconductor layer comprises the top of the first fin.

4. The semiconductor device of claim 1, further comprising:
a source/drain epitaxial stack over the first fin and in contact with the first gate structure; and
an other source/drain epitaxial stack over the vertical structure and in contact with the second gate structure.

5. The semiconductor device of claim 1, wherein the finFET further comprises a second fin disposed over the substrate, wherein a separation between the first and the second fins is smaller than an other separation between the first fin and the vertical structure.

6. The semiconductor device of claim 1, wherein the finFET further comprises a second fin disposed over the substrate, wherein:
the first and the second fins comprise a single semiconductor material; and
the first gate structure is disposed over a top and sides of the second fin.

7. A device, comprising:
a substrate;
a field effect transistor (finFET) on the substrate, the finFET having a first channel length, wherein the finFET comprises a channel region, a buffer region under the channel region, and a shallow trench isolation region adjacent to the buffer region and having a non-planar top surface; and
a gate-all-around FET (GAAFET) on the substrate, the GAAFET having a second channel length different from the first channel length, wherein the GAAFET and the finFET are arranged as neighboring transistors.

8. The device of claim 7, wherein a separation between the finFET and the GAAFET is about 50 nm.

9. The device of claim 7, wherein the finFET comprises two side-by-side channel layers separated by a dielectric material.

10. The device of claim 9, wherein the dielectric material has a width less than about 90 nm.

11. The device of claim 7, wherein the GAAFET comprises a vertically-stacked channel region including multiple channels.

12. The device of claim 7, wherein the finFET and GAAFET comprise high-k gate dielectrics having substantially equal thicknesses.

13. The device of claim 7, wherein the finFET has a gate length between about 2 and about 5 times longer than a gate length of the GAAFET.

14. The device of claim 7, wherein the finFET has a wider gate width than a gate width of the GAAFET.

15. The device of claim 7, wherein the finFET and GAAFET have substantially equal gate heights.

16. A device, comprising:
a fin field effect transistor (finFET) on a substrate, wherein the finFET comprises:
a fin on the substrate;
first source/drain regions extending from the fin;
a first gate structure wrapped around a portion of the fin;
first and second isolation structures, wherein the fin is disposed between the first and second isolation structures, and wherein top surfaces of the first and second isolation structures are coplanar with a top surface of the portion of the fin; and
a plurality of side-by-side channels under the first gate structure and disposed between the first source/drain regions; and
a gate-all-around transistor (GAAFET) on the substrate, wherein the GAAFET comprises:
a nano-sheet stack on the substrate;
second source/drain regions extending from the nano-sheet stack;
a second gate structure wrapped around a portion of the nano-sheet stack; and
a plurality of vertically-stacked channels under the second gate structure and disposed between the second source/drain regions.

17. The device of claim 16, wherein the finFET and the GAAFET are separated by a distance in a range of about 50 nm to about 200 mm.

18. The device of claim 16, wherein the plurality of vertically stacked channels have channel lengths less than about 20 nm.

19. The device of claim 16, wherein nano-sheet layers of the nano-sheet stack have thicknesses less than about 12 nim.

20. The device of claim 16, wherein the first and second gate structures have different widths.

\* \* \* \* \*

UNITED STATES PATENT AND TRADEMARK OFFICE
CERTIFICATE OF CORRECTION

PATENT NO. : 12,199,095 B2
APPLICATION NO. : 17/504211
DATED : January 14, 2025
INVENTOR(S) : Huang et al.

It is certified that error appears in the above-identified patent and that said Letters Patent is hereby corrected as shown below:

In the Claims

In Column 26, Claim 19, Line 35, delete "nim." and insert -- nm. --, therefor.

Signed and Sealed this
Fifteenth Day of April, 2025

Coke Morgan Stewart
*Acting Director of the United States Patent and Trademark Office*